United States Patent
Kim et al.

(10) Patent No.: US 12,289,881 B2
(45) Date of Patent: Apr. 29, 2025

(54) SEMICONDUCTOR DEVICES

(71) Applicant: SAMSUNG ELECTRONICS CO., LTD., Suwon-si (KR)

(72) Inventors: Jongmin Kim, Anyang-si (KR); Chansic Yoon, Anyang-si (KR); Hyosub Kim, Seoul (KR); Sohyun Park, Seoul (KR); Junhyeok Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 373 days.

(21) Appl. No.: 17/948,796

(22) Filed: Sep. 20, 2022

(65) Prior Publication Data
US 2023/0320074 A1   Oct. 5, 2023

(30) Foreign Application Priority Data
Mar. 31, 2022   (KR) .................. 10-2022-0040056

(51) Int. Cl.
*H10B 12/00*   (2023.01)
*H10D 64/23*   (2025.01)

(52) U.S. Cl.
CPC ......... *H10B 12/315* (2023.02); *H10D 64/251* (2025.01)

(58) Field of Classification Search
CPC . H10B 12/315; H10B 12/482; H10B 12/0335
See application file for complete search history.

(56) References Cited

U.S. PATENT DOCUMENTS

| | | | |
|---|---|---|---|
| 9,209,241 B2 | 12/2015 | Kim et al. | |
| 9,337,089 B2 | 5/2016 | Cho | |
| 9,837,490 B2 | 12/2017 | Park et al. | |
| 11,121,135 B1 | 9/2021 | Ikeda | |
| 2014/0117492 A1* | 5/2014 | Kim | H01L 21/76897 |
| | | | 257/508 |

(Continued)

FOREIGN PATENT DOCUMENTS

KR   10-1019712 B1   3/2011

OTHER PUBLICATIONS

Communication dated Jul. 27, 2023, issued from Taiwan Intellectual Property Office in corresponding Taiwanese Patent Application No. 111137554.

*Primary Examiner* — Wasiul Haider
(74) *Attorney, Agent, or Firm* — Sughrue Mion, PLLC

(57) ABSTRACT

Provided is a semiconductor device including a conductive contact plug on a substrate, the conductive contact plug including a lower portion and an upper portion on the lower portion, the lower portion having a first width, and the upper portion having a second width less than the first width, a bit line structure on the conductive contact plug, the bit line structure including a conductive structure and an insulation structure provided in a vertical direction perpendicular to an upper surface of the substrate, and a first lower spacer, a second lower spacer, and a third lower spacer sequentially provided on a sidewall of the lower portion of the conductive contact plug in a horizontal direction parallel to the upper surface of the substrate, wherein an uppermost surface of the third lower spacer is higher than an upper surface of the first lower spacer and an upper surface of the second lower spacer.

10 Claims, 47 Drawing Sheets

(56) References Cited

U.S. PATENT DOCUMENTS

| | | | |
|---|---|---|---|
| 2016/0225710 A1* | 8/2016 | Hwang | ............. H01L 21/02164 |
| 2021/0035613 A1 | 2/2021 | Park et al. | |
| 2022/0037251 A1 | 2/2022 | Park et al. | |

* cited by examiner

SEMICONDUCTOR DEVICES

CROSS-REFERENCE TO RELATED APPLICATION

This application claims priority to Korean Patent Application No. 10-2022-0040056 filed on Mar. 31, 2022 in the Korean Intellectual Property Office, the disclosure of which is hereby incorporated by reference in its entirety.

FIELD

Example embodiments of the present disclosure relate to a semiconductor device. More particularly, example embodiments of the present disclosure relate to a dynamic random access memory (DRAM) device.

DISCUSSION OF RELATED ART

In a DRAM device, a conductive contact plug may be formed under a bit line structure to contact an active pattern, and the conductive contact plug and conductive structures adjacent thereto may be electrically shorted due to misalignment during a manufacturing process of the DRAM device

SUMMARY

One or more example embodiments provide a semiconductor device having improved characteristics.

According to an aspect of an example embodiment, there is provided a semiconductor device including a conductive contact plug on a substrate, the conductive contact plug including a lower portion and an upper portion on the lower portion, the lower portion having a first width, and the upper portion having a second width less than the first width, a bit line structure on the conductive contact plug, the bit line structure including a conductive structure and an insulation structure provided in a vertical direction perpendicular to an upper surface of the substrate, and a first lower spacer, a second lower spacer, and a third lower spacer sequentially provided on a sidewall of the lower portion of the conductive contact plug in a horizontal direction parallel to the upper surface of the substrate, wherein an uppermost surface of the third lower spacer is higher than an upper surface of the first lower spacer and an upper surface of the second lower spacer.

According to another aspect of an example embodiment, there is provided a semiconductor device including an active pattern on a substrate, an isolation pattern provided on a sidewall of the active pattern, a conductive contact plug contacting an upper surface of the active pattern, a bit line structure on the conductive contact plug, a conductive pad structure on the active pattern and the isolation pattern, the conductive pad structure overlapping at least a portion of the conductive contact plug in a horizontal direction parallel to the upper surface of the substrate and including a first pad, a second pad, and a third pad sequentially provided in a vertical direction perpendicular to the upper surface of the substrate, and a first lower spacer and a second lower spacer on a sidewall of the conductive contact plug stacked in the horizontal direction, wherein an uppermost surface of the second lower spacer is higher than an upper surface of the second pad in the vertical direction.

According to another aspect of an example embodiment, there is provided a semiconductor device including an active pattern on a substrate, an isolation pattern on the substrate, the isolation pattern being provided on a sidewall of the active pattern, a gate structure extending in a first direction parallel to an upper surface of the substrate, the gate structure being included in an upper portion of the active pattern and an upper portion of the isolation pattern, a conductive pad structure on the active pattern and the isolation pattern, a conductive contact plug extending through the conductive pad structure and contacting a central upper surface of the active pattern, the conductive contact plug including a lower portion and an upper portion on the lower portion, the lower portion having a first width and the upper portion having a second width less than the first width, a bit line structure on the conductive contact plug and the conductive pad structure, the bit line structure extending in a second direction parallel to the upper surface of the substrate and perpendicular to the first direction, a first lower spacer and a second lower spacer on a sidewall of the lower portion of the conductive contact plug provided in a horizontal direction parallel to the upper surface of the substrate, the first lower spacer and the second lower spacer including different insulating materials from each other, an insulation filling pattern on the first lower spacer and the second lower spacer, an upper spacer structure on the insulation filling pattern, the upper spacer structure being provided on a sidewall of the bit line structure, a contact plug structure on the conductive pad structure, and a capacitor on the contact plug structure, wherein an uppermost surface of the first lower spacer and an uppermost surface of the second lower spacer are coplanar with an upper surface of the lower portion of the conductive contact plug.

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

The above and other aspects and features of a semiconductor device and a method of forming the same in accordance with example embodiments will become readily understood from detail descriptions that follow, with reference to the accompanying drawings. It will be understood that, although the terms "first," "second," and/or "third" may be used herein to describe various materials, layers (films), regions, electrodes, pads, patterns, structures and processes, these materials, layers (films), regions, electrodes, pads, patterns, structures and processes should not be limited by these terms. These terms are only used to distinguish one material, layer (film), region, electrode, pad, pattern, structure and process from another material, layer (film), region, electrode, pad, pattern, structure and process. Thus, a first material, layer (film), region, electrode, pad, pattern, structure and process discussed below could be termed a second or third material, layer (film), region, electrode, pad, pattern, structure and process without departing from the teachings of inventive concepts.

FIGS. 1 to 28 are plan views and cross-sectional views illustrating a method of manufacturing a semiconductor device in accordance with example embodiments. Particularly, FIGS. 1, 3, 5, 22 and 26 are the plan views, FIG. 2 includes cross-sections taken along lines A-A' and B-B' of FIG. 1, and FIGS. 4, 6-21, 23-25 and 27-28 are cross-sectional views taken along lines A-A' of corresponding plan views, respectively.

Hereinafter, in the specification (and not necessarily in the claims), two directions substantially parallel to an upper surface of a substrate 100 and substantially perpendicular to each other may be referred to as first and second directions D1 and D2, respectively, and a direction substantially parallel to the upper surface of the substrate 100 and having an acute angle with respect to the first and second directions D1 and D2 may be referred to as a third direction D3.

Figure 1:
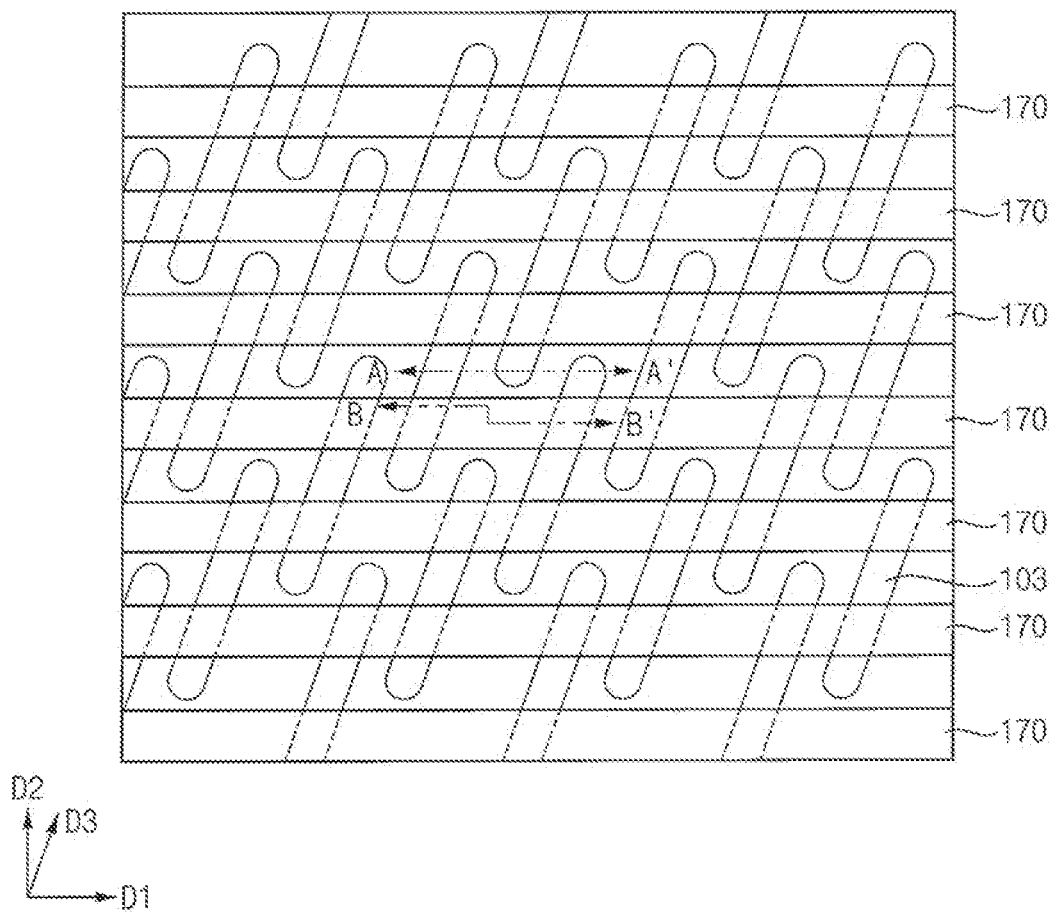
FIGS. 1 to 28 are plan views and cross-sectional views illustrating a method of manufacturing a semiconductor device in accordance with example embodiments.
Figure 2:
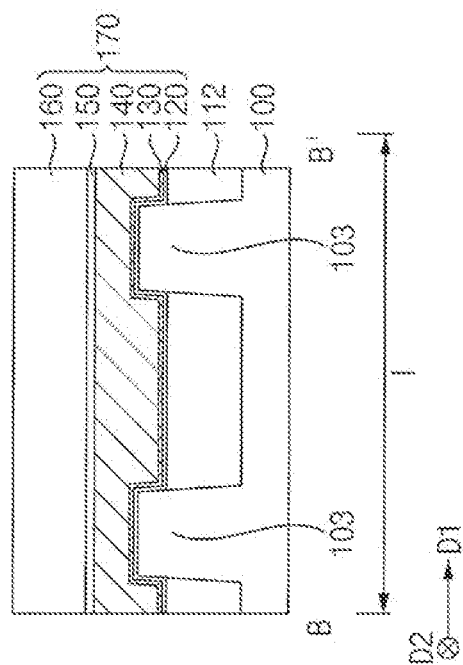
Figure 2:
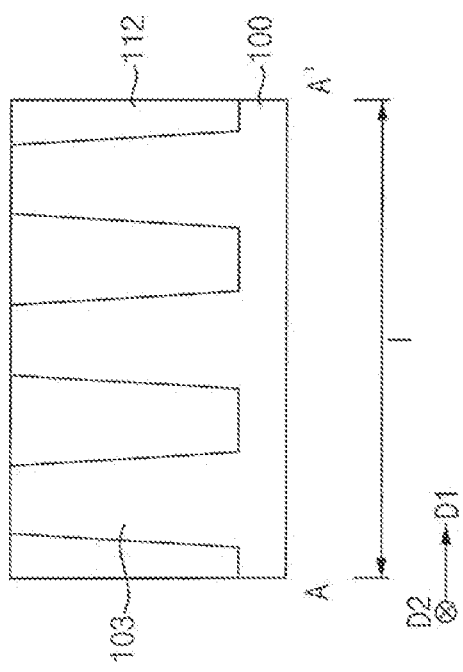

Referring to FIGS. 1 and 2, an active pattern 103 may be formed on a substrate 100, and an isolation pattern 112 may be formed on and to cover a sidewall of the active pattern 103.

The substrate 100 may include silicon, germanium, silicon-germanium, or a III-V group compound semiconductor, such as gallium phosphide (GaP), gallium arsenide (GaAs), or gallium antimonide (GaSb). In example embodiments, the substrate 100 may be a silicon-on-insulator (SOI) substrate or a germanium-on-insulator (GOI) substrate.

The active pattern 103 may be formed by removing an upper portion of the substrate 100 to form a first recess, and may extend in the third direction D3. A plurality of active patterns 103 may be spaced apart from each other in the first and second directions D1 and D2. The isolation pattern 112 may be formed in the first recess, and may include an oxide, e.g., silicon oxide.

The active pattern 103 and the isolation pattern 112 may be partially removed to form a second recess extending in the first direction D1.

A gate structure 170 may be formed in the second recess. The gate structure 170 may include a gate insulation pattern 120 on a bottom and a sidewall of the second recess, a first barrier pattern 130 on a portion of the gate insulation pattern 120 on the bottom and a lower sidewall of the second recess, a first conductive pattern 140 on the first barrier pattern 130 and filling a lower portion of the second recess, a second conductive pattern 150 on the first barrier pattern 130 and an upper surface of the first conductive pattern 140, and a gate mask 160 on an upper surface of the second conductive pattern 150 and an upper inner sidewall of the gate insulation pattern 120 and filling an upper portion of the second recess. The first barrier pattern 130, the first conductive pattern 140 and the second conductive pattern 150 may form a gate electrode.

The gate insulation pattern 120 may include an oxide, e.g., silicon oxide, the first barrier pattern 130 may include a metal nitride, e.g., titanium nitride, tantalum nitride, etc., the first conductive pattern 140 may include, e.g., a metal, a metal nitride, a metal silicide, doped polysilicon, etc., the second conductive pattern 150 may include, e.g., doped polysilicon, and the gate mask 160 may include a nitride, e.g., silicon nitride.

In example embodiments, the gate structure 170 may extend in the first direction D1, and a plurality of gate structures 170 may be spaced apart from each other in the second direction D2.

Figure 3:
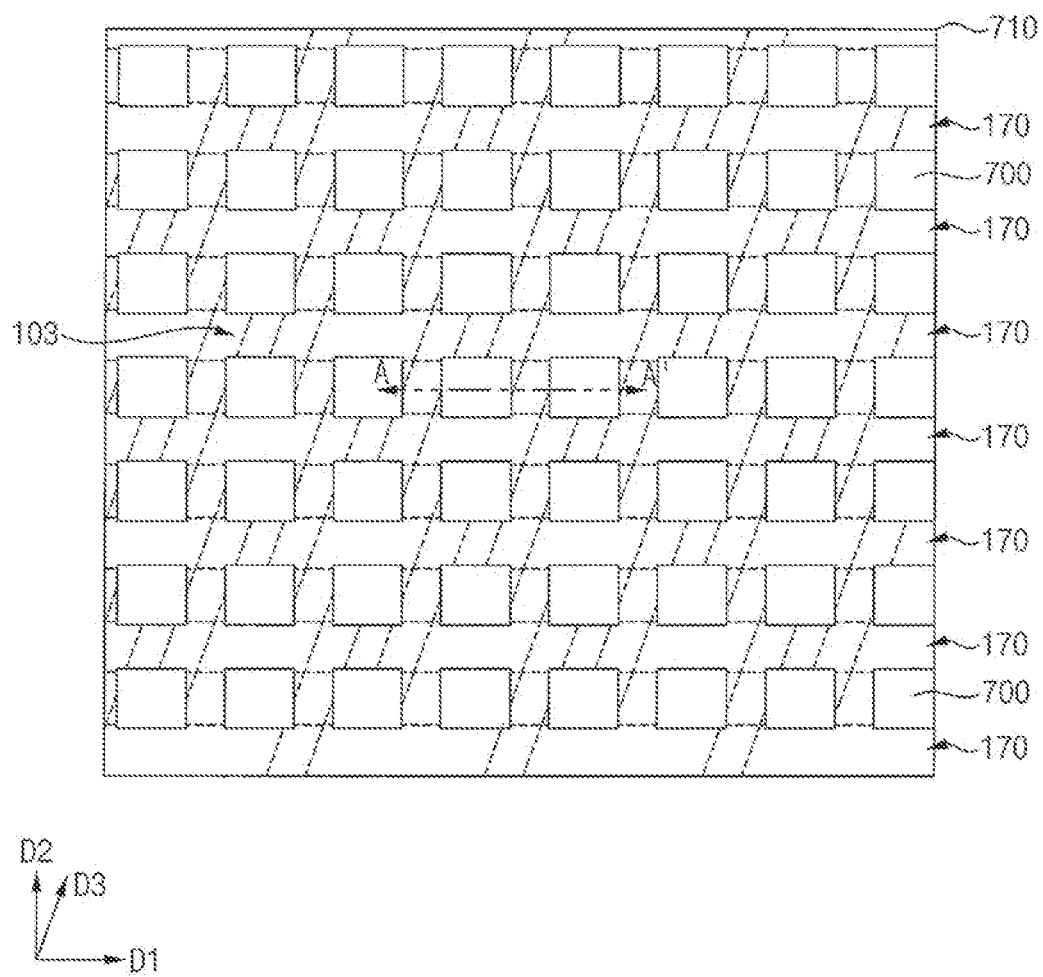
Figure 4:
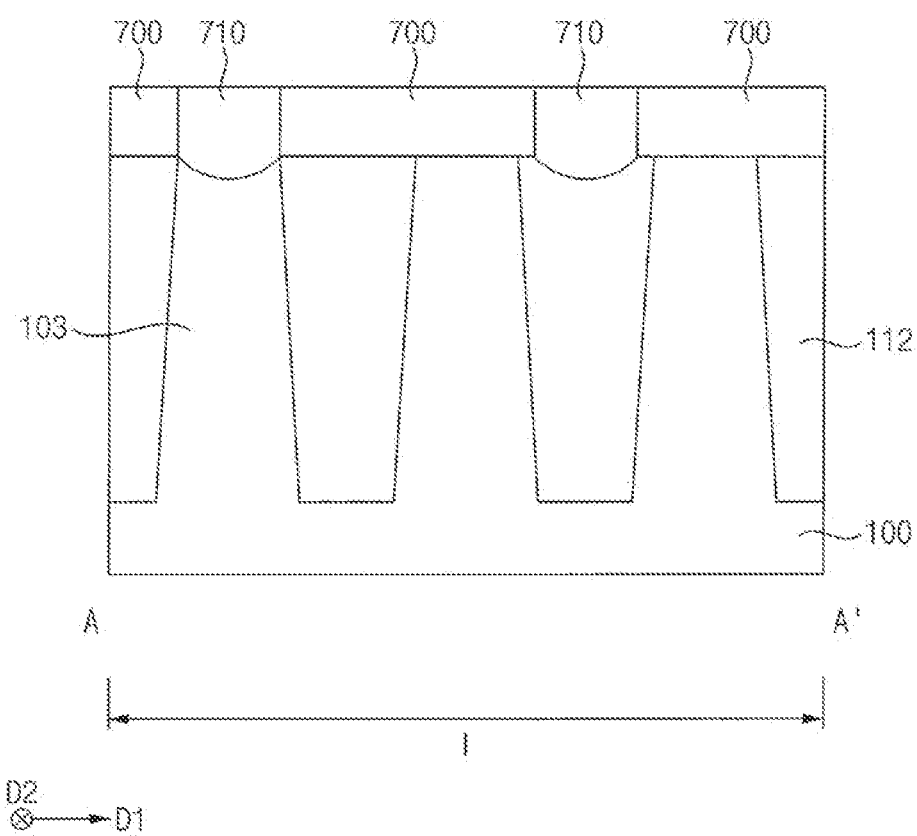

Referring to FIGS. 3 and 4, a first pad 700 and a second pad 710 may be formed on the substrate 100 having the active pattern 103, the isolation pattern 112 and the gate structure 170 thereon.

In example embodiments, a first pad layer may be formed on the substrate 100, the first pad layer may be patterned to form a first opening exposing upper surfaces of the active pattern 103, the isolation pattern 112 and the gate structure 170, and a second pad 710 may be formed in the first opening. According to another example, a second pad layer may be formed on the substrate 100 and may be patterned to form the second pad 710, and the first pad 700 may be formed.

The first pad 700 may include, e.g., doped polysilicon, a metal such as tungsten ruthenium, etc., a metal nitride such as titanium nitride, tantalum nitride, etc., or graphene. In an example embodiment, the first pad 700 may be a single layer including one of the above-mentioned materials. According to another example, the first pad 700 may be a multi-layer including a plurality of stacked layers, each of which may include one of the above-mentioned materials.

The second pad 710 may include a nitride, e.g., silicon nitride.

In example embodiments, the first opening may include a first portion extending in the first direction D1 and a second portion extending in the second direction D2, and the first and second portions may be connected with each other. Thus, the second pad 710 may include a first extension portion extending in the first direction D1 and a second extension portion extending in the second direction D2, and the first and second extension portions may be connected with each other. In example embodiments, a plurality of first pads 700 may be spaced apart from each other in the first and second directions D1 and D2, and may be arranged in a lattice pattern in a plan view.

In example embodiments, the first pad 700 may overlap in a vertical direction (D3 direction) an end portion of each active pattern 103 extending in the third direction D3 and a portion of the isolation pattern 112 adjacent thereto in the first direction D1.

Figure 5:
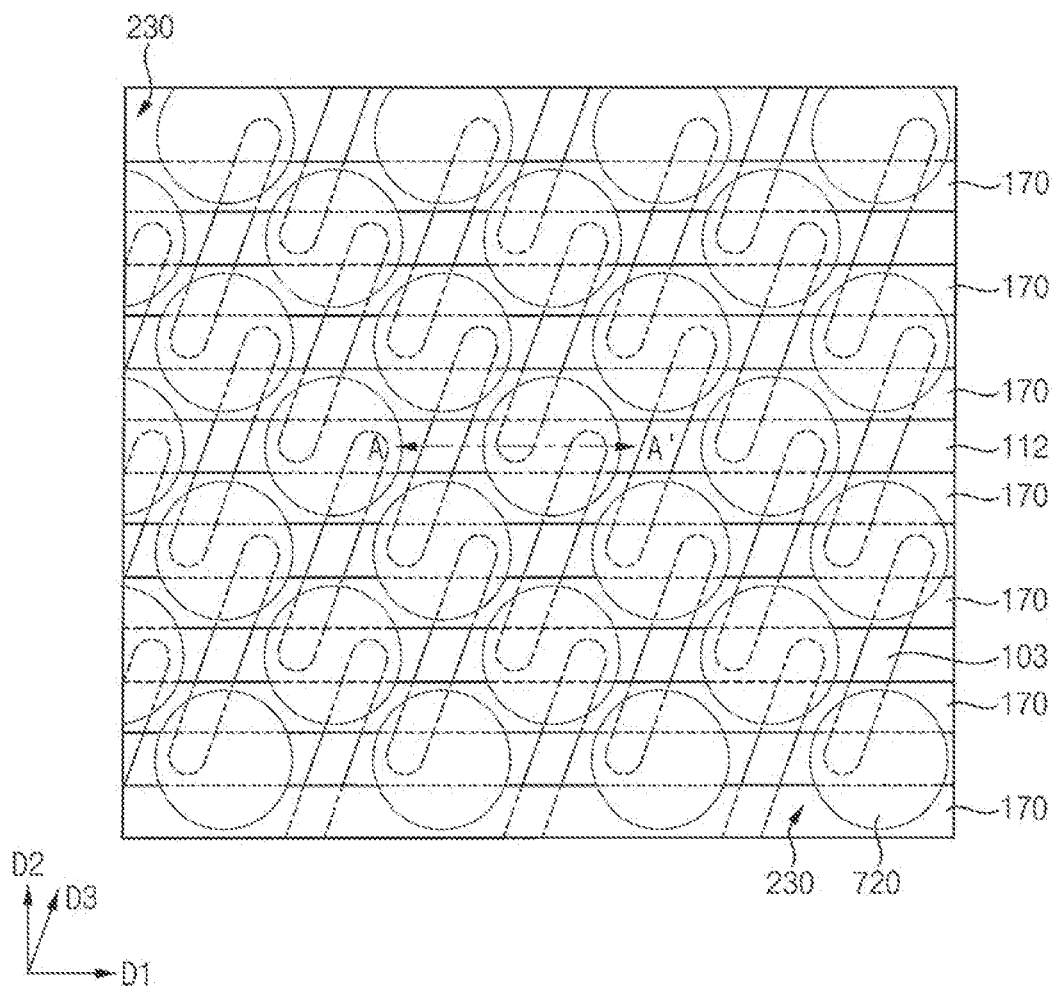
Figure 6:
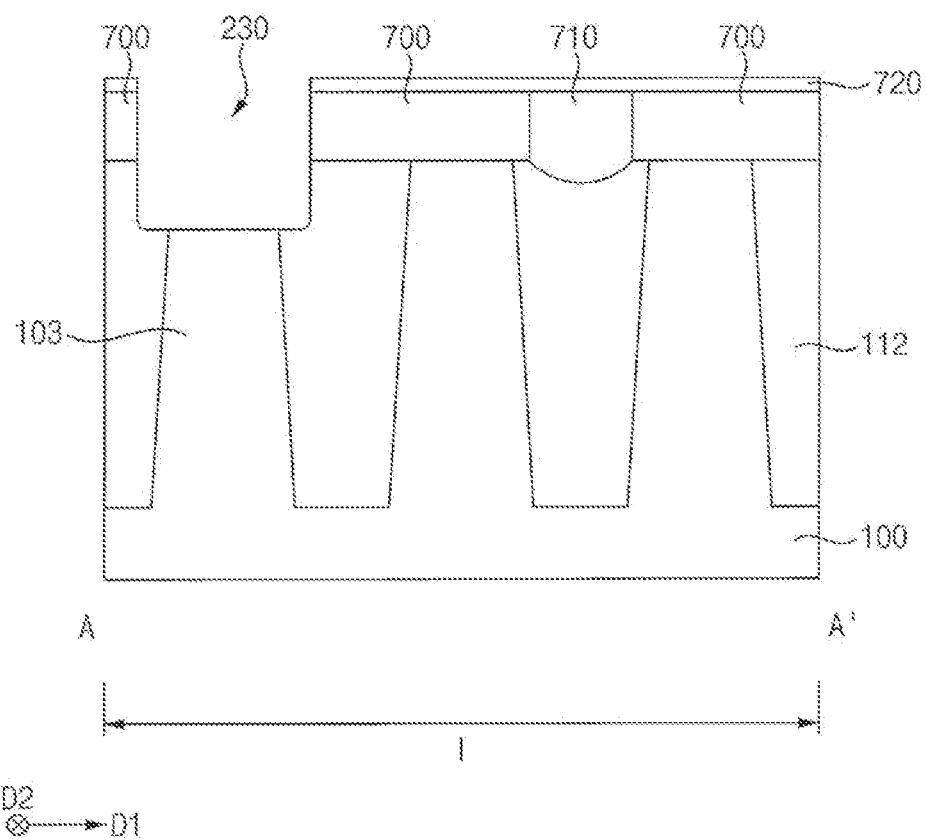

Referring to FIGS. 5 and 6, a third pad layer may be formed on the first and second pads 700 and 710, and may be patterned to form a third pad 720, and the active pattern 103, the isolation pattern 112, and the gate mask 160 included in the gate structure 170 may be partially etched using the third pad 720 as an etching mask to form a second opening 230.

In example embodiments, the third pad 720 may have, for example, a shape of a circle or an ellipse in a plan view, and a plurality of third pads 720 may be formed to be spaced apart from each other in the first and second directions D1 and D2. Each of the third pads 720 may overlap in the vertical direction end portions of the active patterns 103 neighboring in the first direction D1 and a portion of the isolation pattern 112 between the end portions of the active patterns 103. The third pad 720 may include a nitride, e.g., silicon nitride.

Figure 7:
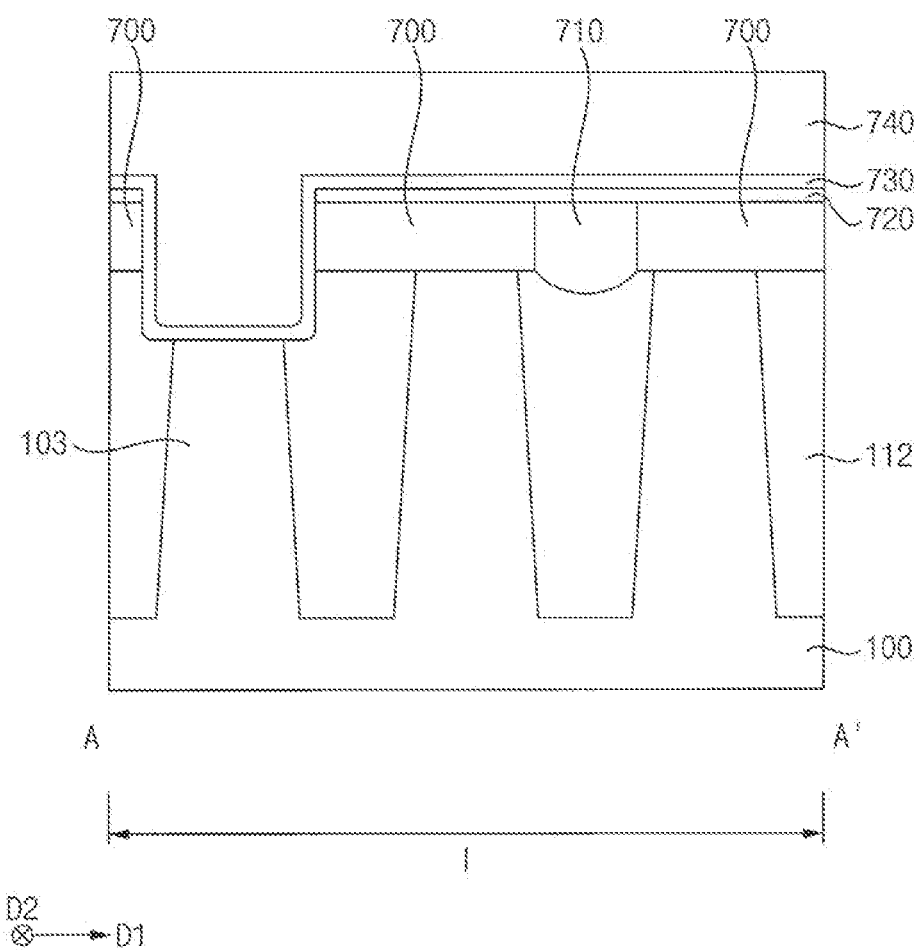

Referring to FIG. 7, a first lower spacer layer 730 may be formed on a sidewall and a bottom of the second opening 230 and on an upper surface of the third pad 720, and a first sacrificial layer 740 may be formed on the first lower spacer layer 730 to fill the second opening 230.

The first lower spacer layer 730 may include a nitride, e.g., silicon nitride, and the first sacrificial layer 740 may include, e.g., spin-on-hardmask (SOH), amorphous carbon layer (ACL), etc.

Figure 8:
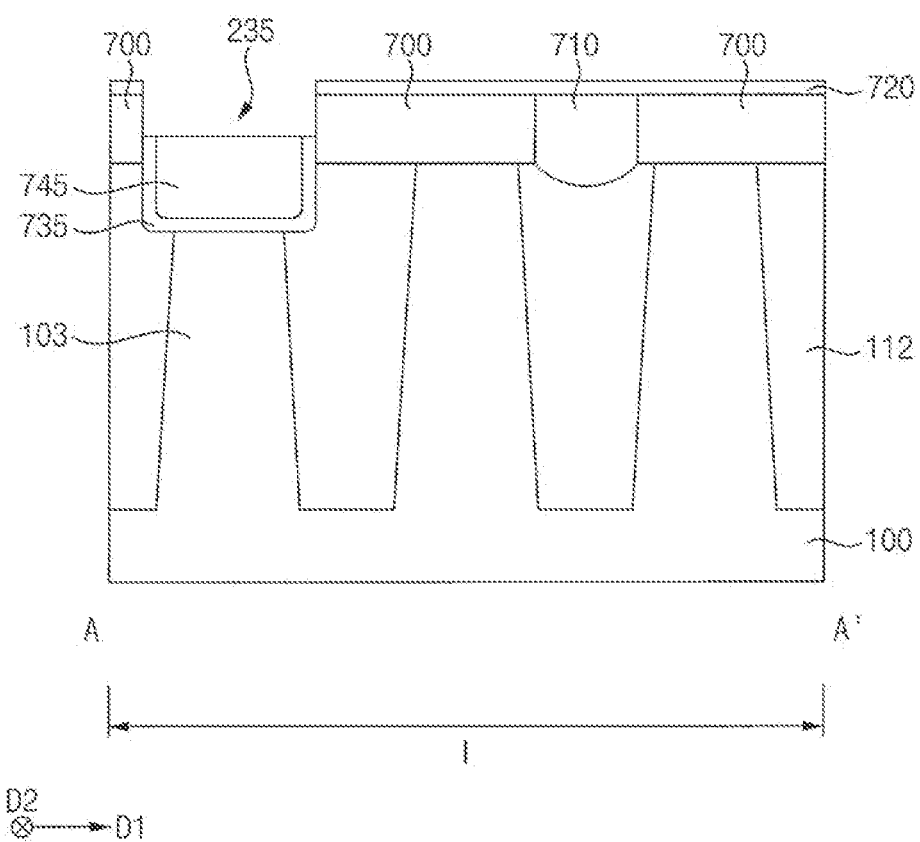

Referring to FIG. 8, an upper portion of the first sacrificial layer 740 may be removed through an etch-back process, so that a lower portion of the first sacrificial layer 740 may remain in a lower portion of the second opening 230, and a portion of the first lower spacer layer 730 on the upper surface of the third pad 720 and an upper sidewall of the second opening 230 may be exposed.

The lower portion of the first sacrificial layer 740 remaining in the lower portion of the second opening 230 may be referred to as a first sacrificial pattern 745. In example embodiments, an upper surface of the first sacrificial pattern 745 may be higher than an upper surface of the isolation pattern 112 or a lower surface of the first pad 700 in the D3 direction.

The exposed portion of the first lower spacer layer 730 may be removed by, for example, a stripping process to form a first lower spacer 735 on a lower sidewall and the bottom of the second opening 230. The upper surface of the first sacrificial pattern 745 remaining in the lower portion of the second opening 230 may serve as an etch stop layer during the stripping process, so that uppermost surfaces of a plurality of first lower spacers 735 formed in a plurality of second openings 230, respectively, by the stripping process may be substantially coplanar with each other.

In example embodiments, the uppermost surface of the first lower spacer 735 may be substantially coplanar with the upper surface of the first sacrificial pattern 745 adjacent thereto, so that the uppermost surface of the first lower spacer 735 may be higher than the upper surface of the isolation pattern 112 or the lower surface of the first pad 700.

Upper portions of the first sacrificial layer 740 and the first lower spacer layer 730 may be removed to form a third recess 235 in an upper portion of the second opening 230

Figure 9:
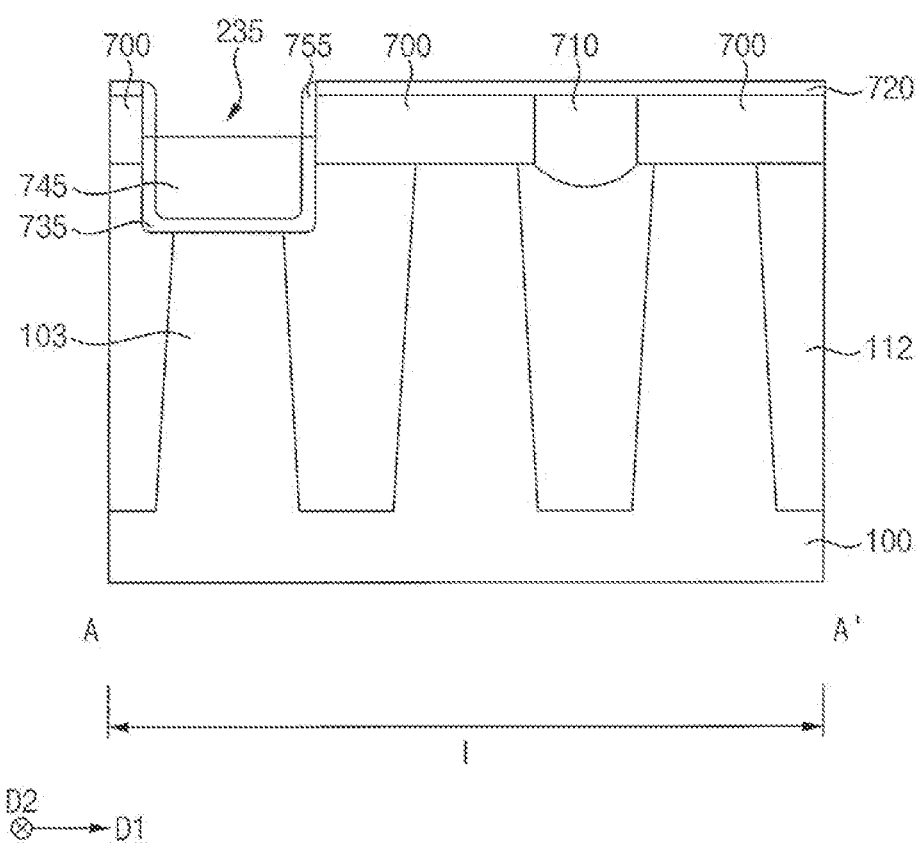

Referring to FIG. 9, a first sacrificial spacer layer may be formed on a bottom and sidewall of the third recess 235 and on the upper surface of the third pad 720 by, e.g., an atomic layer deposition (ALD) process, and may be anisotropically etched to form a first sacrificial spacer 755 on the sidewall of the third recess 235.

The first sacrificial spacer 755 may include, an oxide, e.g. silicon oxide, and may be formed on the uppermost surface of the first lower spacer 735.

Figure 10:
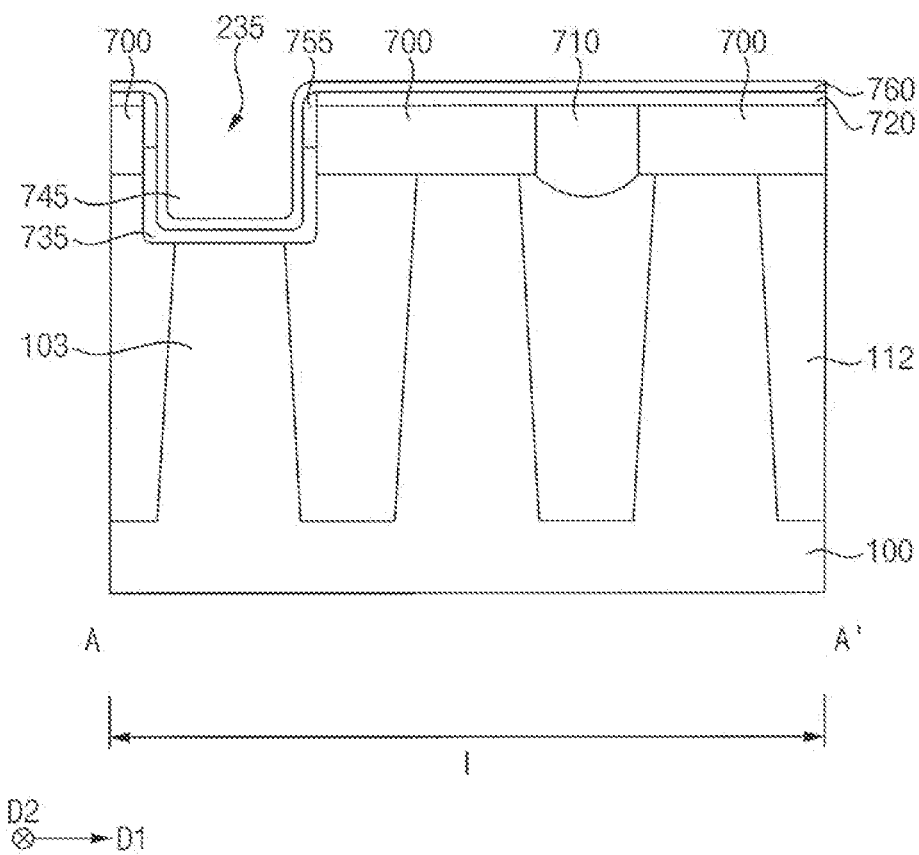

Referring to FIG. 10, the first sacrificial pattern 745 may be removed to expose a surface of the first lower spacer 735, and thus most of the second opening 230 may be re-formed.

A second lower spacer layer 760 may be formed on the exposed surface of the first lower spacer 735, a surface of the first sacrificial spacer 755, and the upper surface of the third pad 720.

The first sacrificial pattern 745 may be removed by, e.g., an ashing process and/or a stripping process.

The second lower spacer layer 760 may include, e.g., silicon oxycarbide (SiOC).

Figure 11:
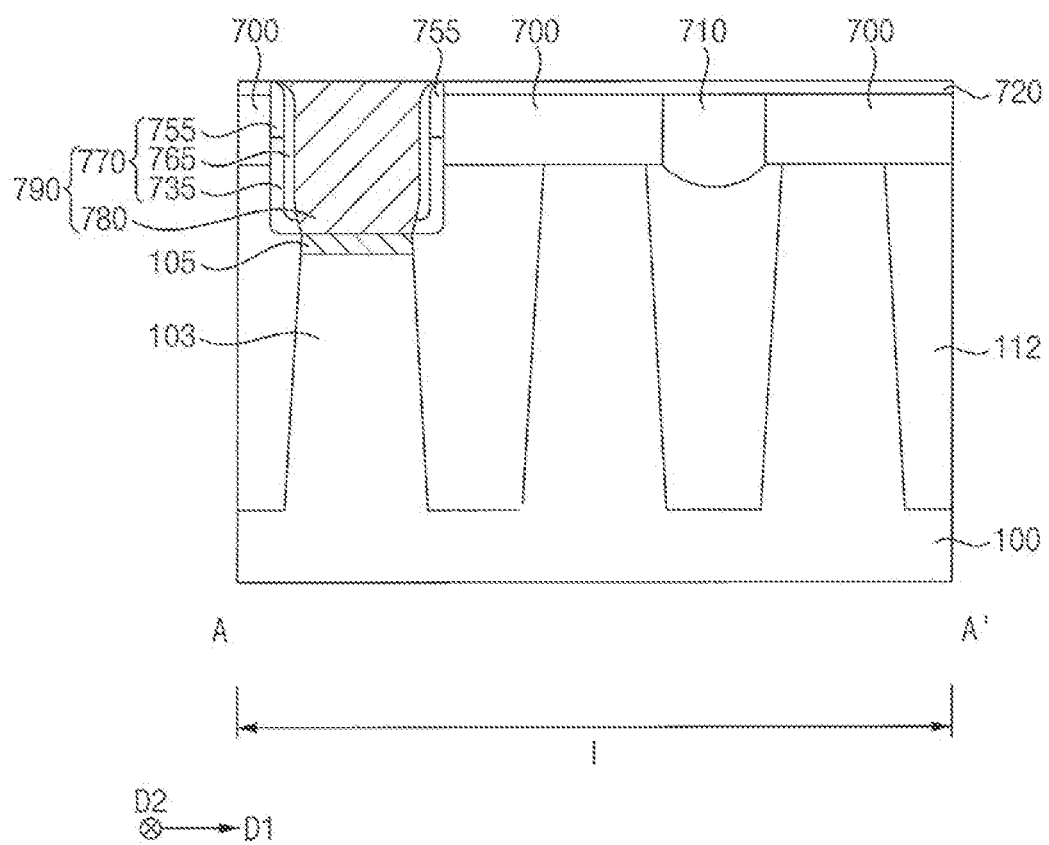

Referring to FIG. 11, the second lower spacer layer 760 and the first lower spacer 735 thereunder may be anisotropically etched.

A portion of the second lower spacer layer 760 on the upper surface of the third pad 720, and portions of the first lower spacer 735 and the second lower spacer layer 760 on the bottom of the second opening 230 may be removed by the anisotropic etching process.

Accordingly, the first lower spacer 735 and the first sacrificial spacer 755 may be sequentially stacked in a vertical direction substantially perpendicular to the upper surface of the substrate 100 on the sidewall of the second opening 230, and a second lower spacer 765 may be formed on inner sidewalls of the first lower spacer 735 and the first sacrificial spacer 755. The first and second lower spacers 735 and 765 and the first sacrificial spacer 755 may form a first preliminary lower spacer structure 770.

An upper surface of a portion of the active pattern 103 under the second opening 230, that is, the upper surface of the portion of the active pattern 103 not covered by the first preliminary lower spacer structure 770 may be exposed by the anisotropic etching process. A first metal layer may be formed on the upper surface of the exposed portion of the active pattern 103, an inner sidewall of the first preliminary lower spacer structure 770 and the upper surface of the third pad 720, and a heat treatment may be performed on the first metal layer, for example, a silicidation process may be performed so that the first metal layer and the active pattern 103 including silicon are reacted with each other to form a first metal silicide pattern 105 on the upper portion of the active pattern 103 exposed by the second opening 230.

The first metal silicide pattern 105 may include, e.g., titanium silicide, cobalt silicide, nickel silicide, etc., and an unreacted portion of the first metal layer with the active pattern 103 may be removed.

A first filling pattern 780 may be formed in the second opening 230. The first filling pattern 780 may be formed in the second opening 230 by forming a first filling layer to fill the second opening 230 on an upper surface of the first metal silicide pattern 105, the inner sidewall of the first preliminary lower spacer structure 770, and the upper surface of the third pad 720, and performing an etch back process and/or an chemical mechanical polishing (CMP) process on the first filling layer. The first filling pattern 780 may include a metal nitride, e.g., titanium nitride, tantalum nitride, tungsten nitride, etc., and/or a metal, e.g., titanium, tantalum, tungsten, etc.

The first preliminary lower spacer structure 770 and the first filling pattern 780 in the second opening 230 may form a first preliminary filling structure 790.

Figure 12:
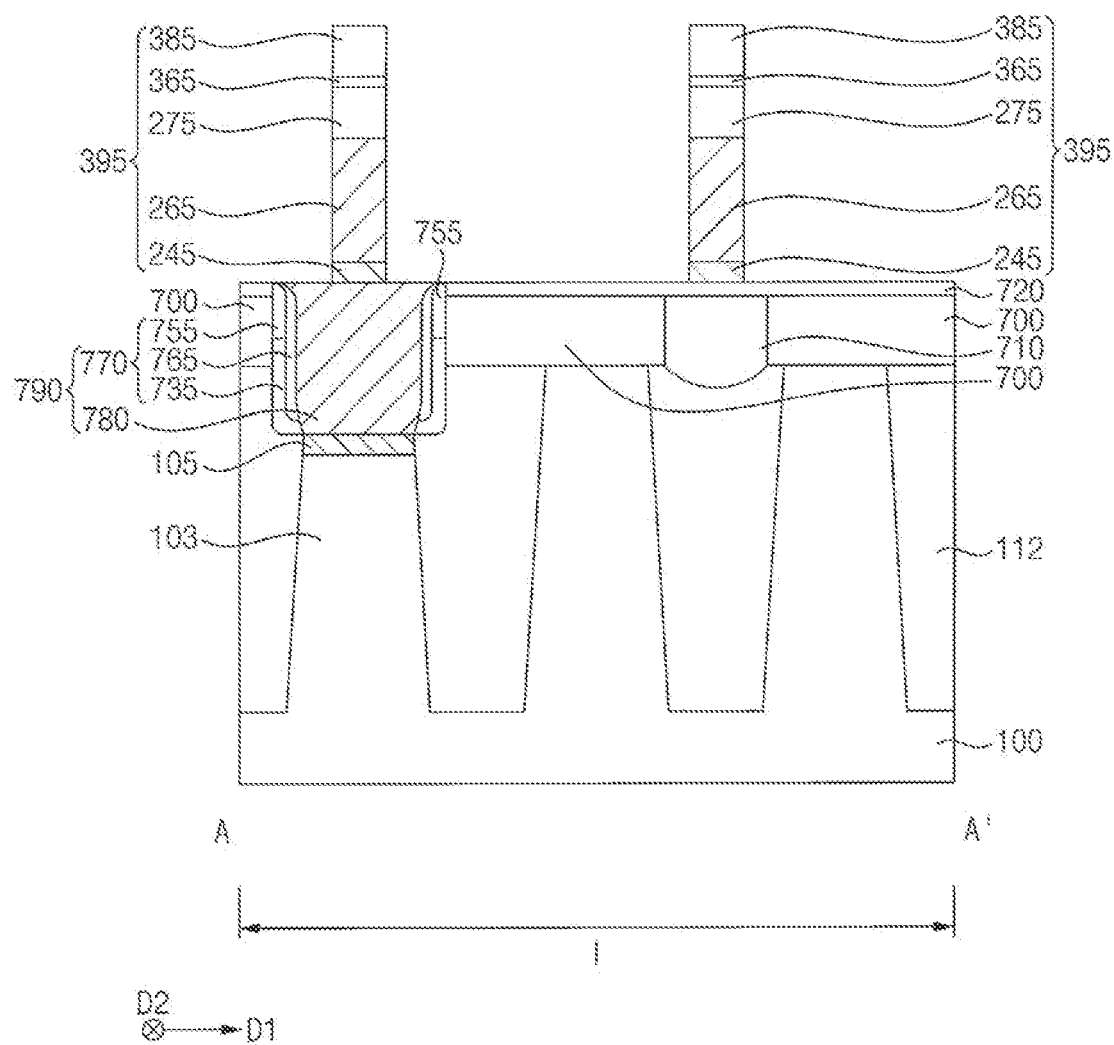

Referring to FIGS. 12, an adhesive layer, a third conductive layer, a first mask layer, a first etch stop layer, and a first capping layer may be sequentially formed on the third pad 720 and the first preliminary filling structure 790, the first capping layer may be patterned to form a first capping pattern 385, and the first etch stop layer, the first mask layer, the third conductive layer, and the adhesive layer may be sequentially etched using the first capping pattern 385 as an etching mask.

An adhesive pattern 245, a third conductive pattern 265, a first mask 275, a first etch stop pattern 365 and the first capping pattern 385 may be sequentially stacked on the first preliminary filling structure 790 and the third pad 720 by the etching process.

The adhesive pattern 245 may include a metal nitride, e.g., titanium nitride, tantalum nitride, tungsten nitride, etc., the third conductive pattern 265 may include, a metal e.g., tungsten, titanium, tantalum, ruthenium, etc., and each of the first mask 275, the first etch stop pattern 365, and the first capping pattern 385 may include an insulating nitride, e.g., silicon nitride.

The adhesive pattern 245 may be formed between the third pad 720 including an insulating nitride e.g., silicon nitride and the third conductive pattern 265 including a metal e.g., tungsten, so that the adhesive pattern 245 and the third conductive pattern 265 may adhere well to each other.

Hereinafter, the adhesive pattern 245, the third conductive pattern 265, the first mask 275, the first etch stop pattern 365, and the first capping pattern 385 sequentially stacked may be referred to as a bit line structure 395. The bit line structure 395 may include a conductive structure having the adhesive pattern 245 and the third conductive pattern 265, and an insulation structure having the first mask 275, the first etch stop pattern 365, and the first capping pattern on the conductive structure. In an example embodiment, first mask 275, the first etch stop pattern 365, and the first capping pattern 385 may be merged to form a single insulation structure.

In example embodiments, the bit line structure 395 may extend in the second direction D2 on the substrate 100, and a plurality of bit line structures 395 may be spaced apart from each other in the first direction D1.

Figure 13:
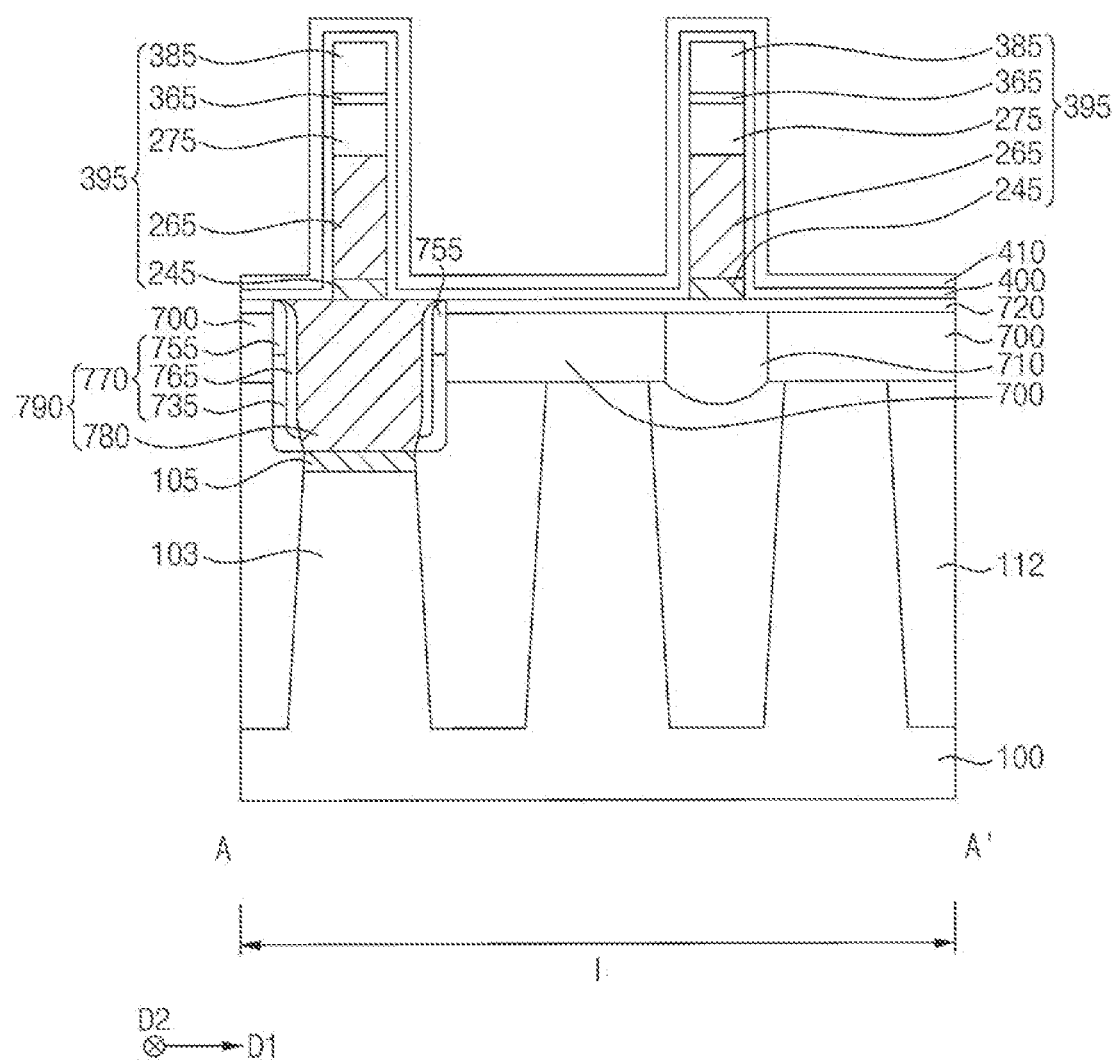

Referring to FIG. 13, a second sacrificial spacer layer 400 and a third sacrificial spacer layer 410 may be formed on the bit line structure 395, the first preliminary filling structure 790, and the third pad 720.

The second sacrificial spacer layer 400 may include an insulating nitride, e.g., silicon nitride, and the third sacrificial spacer layer 410 may include a material substantially the same as that of the second lower spacer 765, e.g., silicon oxycarbide (SiOC).

In an example embodiment, the second sacrificial spacer layer 400 may not be formed, and the third sacrificial spacer layer 410 may directly contact the bit line structure 395, the first preliminary filling structure 790, and the third pad 720.

A plasma nitridation process may be further performed on the bit line structure 395, specifically, the third conductive pattern 265 included therein before forming the second sacrificial spacer layer 400.

Figure 14:
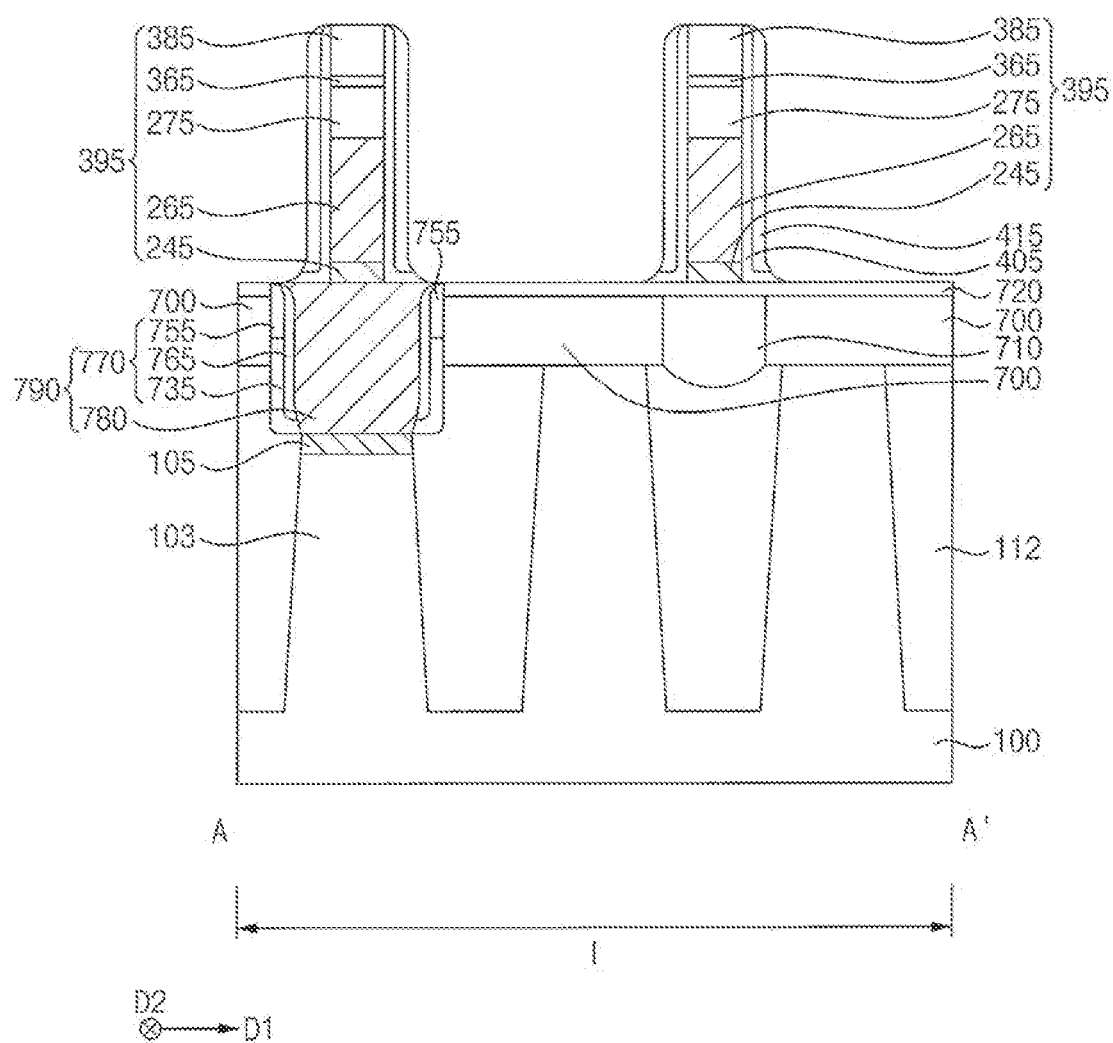

Referring to FIG. 14, the second and third sacrificial spacer layers 400 and 410 may be anisotropically etched to form a second sacrificial spacer 405 and a third sacrificial spacer 415, respectively, which may be sequentially stacked on a sidewall of the bit line structure 395.

Accordingly, an upper surface of the first preliminary lower spacer structure 770 included in the first preliminary filling structure 790, the upper surface of the third pad 720, and an upper surface of the bit line structure 395 may be exposed.

Figure 15:
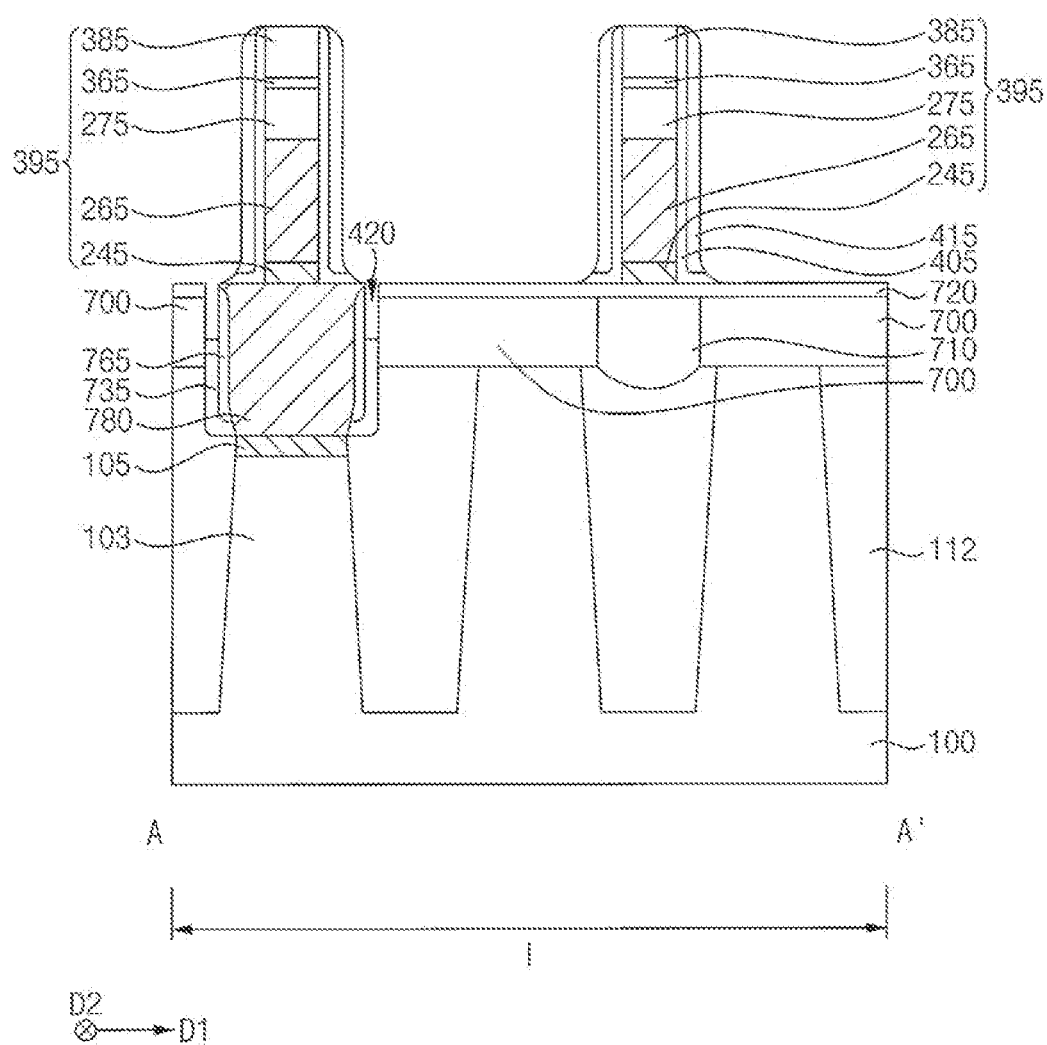

Referring to FIG. 15, the first sacrificial spacer 755 included in the exposed first preliminary lower spacer structure 770 may be removed, and thus a third opening 420 exposing an uppermost surface of the first lower spacer 735 may be formed.

In example embodiments, the first sacrificial spacer 755 may be removed by a wet etching process using, e.g., hydrofluoric acid (HF) as an etchant, and the first lower spacer 735 thereunder may serve as an etch stop layer. Accordingly, bottoms of a plurality of third openings 420 that may be formed by removing a plurality of first sacrificial spacers 755 in the respective second openings 23 may be substantially coplanar with each other.

As the first sacrificial spacer 755 is removed, an upper outer sidewall of the second lower spacer 765 may be exposed.

Figure 16:
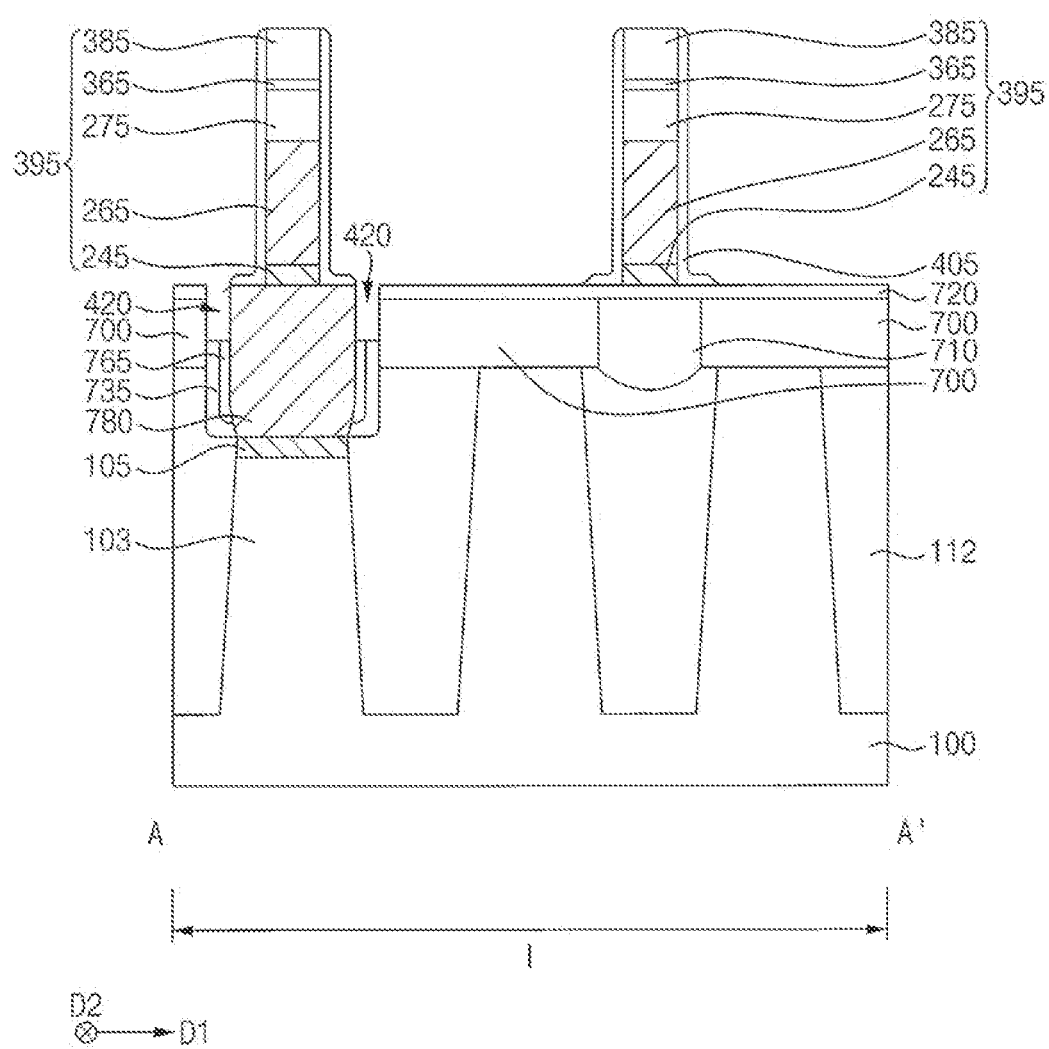

Referring to FIG. 16, an upper portion of the exposed second lower spacer 765 and the third sacrificial spacer 415 on the sidewall of the bit line structure 395 may be removed. Accordingly, a width of the third opening 420 may be enlarged, and an upper sidewall of the first filling pattern 780 and a surface of the second sacrificial spacer 400 may be exposed.

In example embodiments, the upper portion of the second lower spacer 765 and the third sacrificial spacer 415 may be removed by, e.g., an ashing process using oxygen (O2) and/or a stripping process using hydrofluoric acid (HF).

In an embodiment, as the upper portion of the second lower spacer 765 is removed, an uppermost surface of the remaining second lower spacer 765 may be substantially coplanar with the uppermost surface of the first lower spacer 735.

Figure 17:
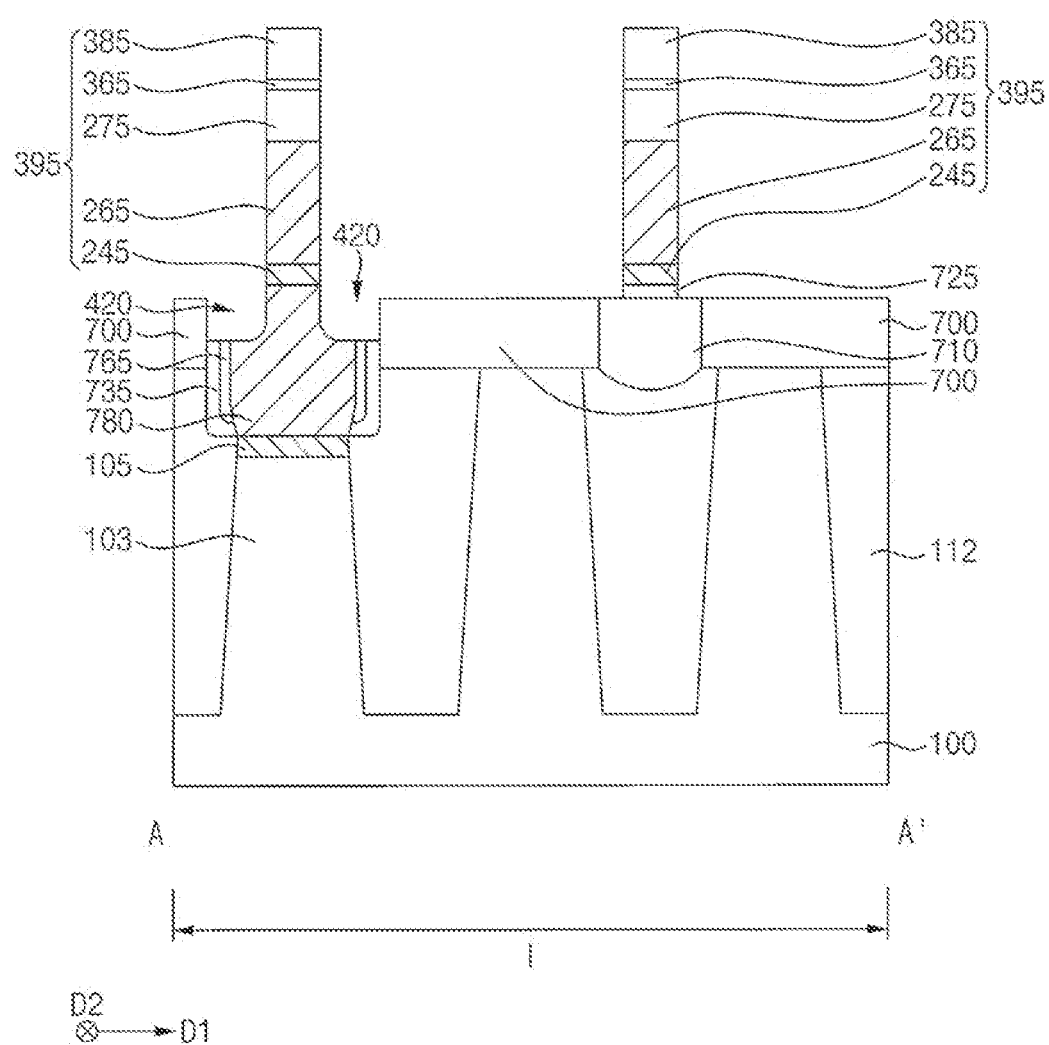

Referring to FIG. 17, the second sacrificial spacer 405 on the sidewall of the bit line structure 395, and a portion of the first filling pattern 780 not covered by the bit line structure 395 and exposed by the third opening 420 may be removed by an etching process.

The first filling pattern 780 remaining in the second opening 230 after the etching process may include a conductive material, and may contact each of a lower surface of the bit line structure 395 and the first metal silicide pattern 105 on the upper surface of the active pattern 103. Hence, the remaining first filling pattern 780 may be referred to as a conductive contact plug 780. The first filling pattern 780 may include a lower portion having a relatively large width and an upper portion having a relatively small width. In an example embodiment, an upper surface of the lower portion of the first filling pattern 780 may be substantially coplanar with the uppermost surfaces of the first and second lower spacers 735 and 765.

A portion of the third pad 720 not covered by the bit line structure 395 may also be removed during the etching process, and thus upper surfaces of the first and second pads 700 and 710 may be exposed. However, a portion of the third pad 720 between the second pad 710 and the bit line structure 395 may remain as a third pad pattern 725.

As the etching process is performed, the width of the third opening 420 may be further enlarged.

Figure 18:
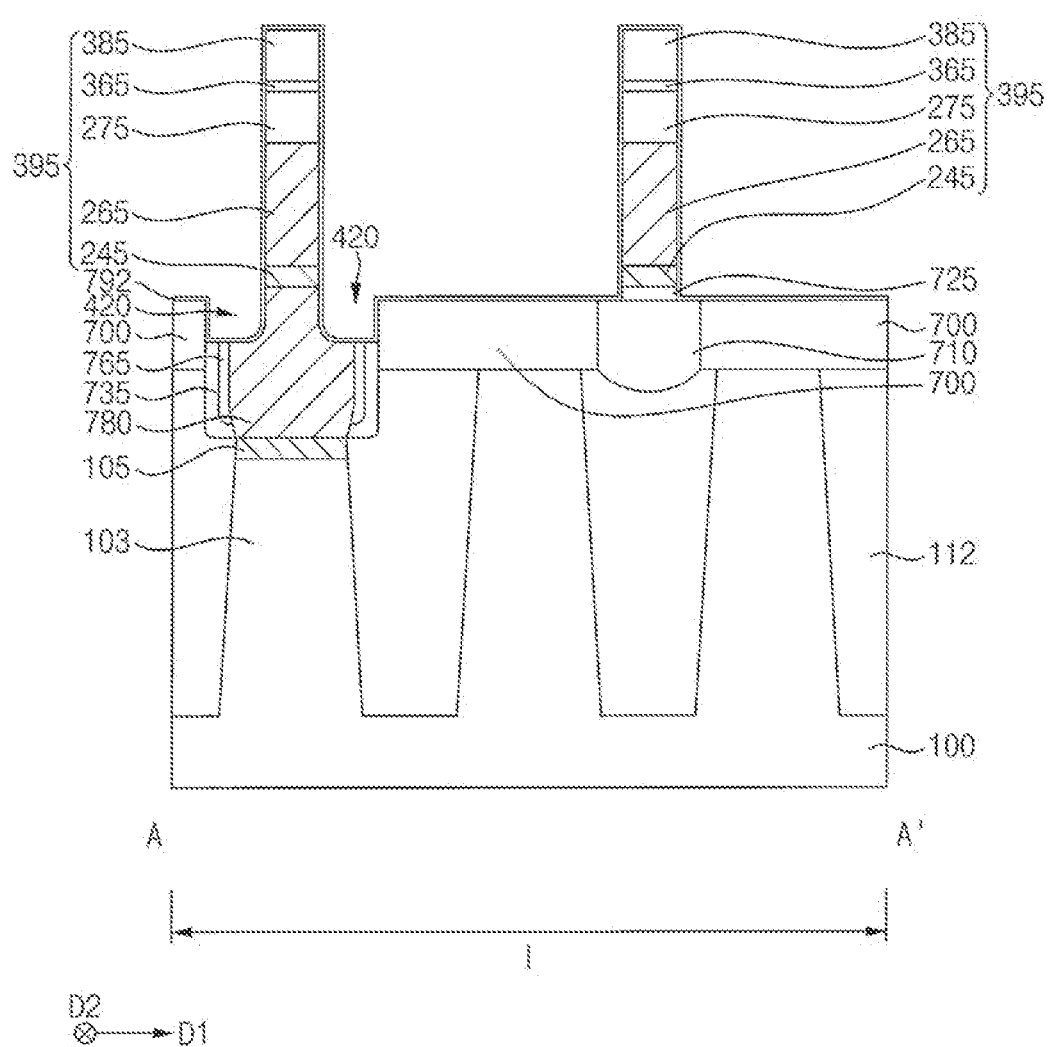

Referring to FIG. 18, a second capping layer 792 may be formed by, e.g., an ALD process on the bit line structure 395, the first filling pattern 780, the first and second lower spacers 735 and 765, and the first and second pads 700 and 710.

The second capping layer 792 may include an oxide, e.g., silicon oxide or an insulating nitride, e.g., silicon nitride.

Figure 19:
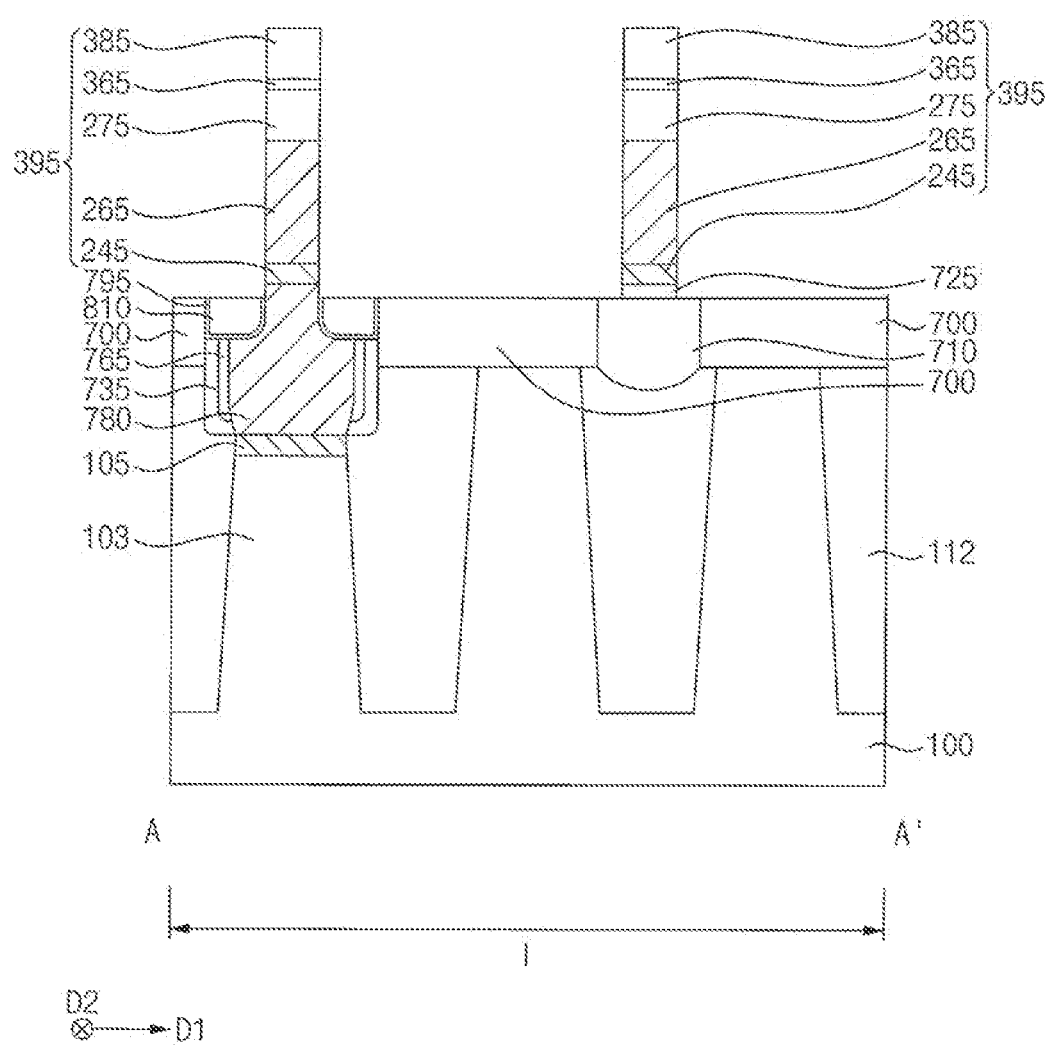

Referring to FIG. 19, a second filling layer may be formed on the second capping layer 792 to fill the third opening 420, and may be etched until the upper surfaces of the first and second pads 700 and 710 are exposed.

A portion of the second capping layer 792 at an outside of the third opening 420 may also be removed during the etching process, and accordingly, the upper surface and the sidewall of the bit line structure 395, the upper surfaces of the first and second pads 700 and 710 and a sidewall of the third pad pattern 725 may be exposed.

Accordingly, a second capping pattern 795 may remain on an inner wall of the third opening 420, and a second filling pattern 810 may be formed on the second capping pattern 795. The first and second filling patterns 780 and 810, the first and second lower spacers 735 and 765 and the second capping pattern 795 in the second opening 230 may form a first filling structure. Additionally, the first and second lower spacers 735 and 765 on a sidewall of the lower portion of the first filling pattern 780 may form a first lower spacer structure.

The second filling pattern 810 may include an insulating nitride e.g., silicon nitride.

Figure 20:
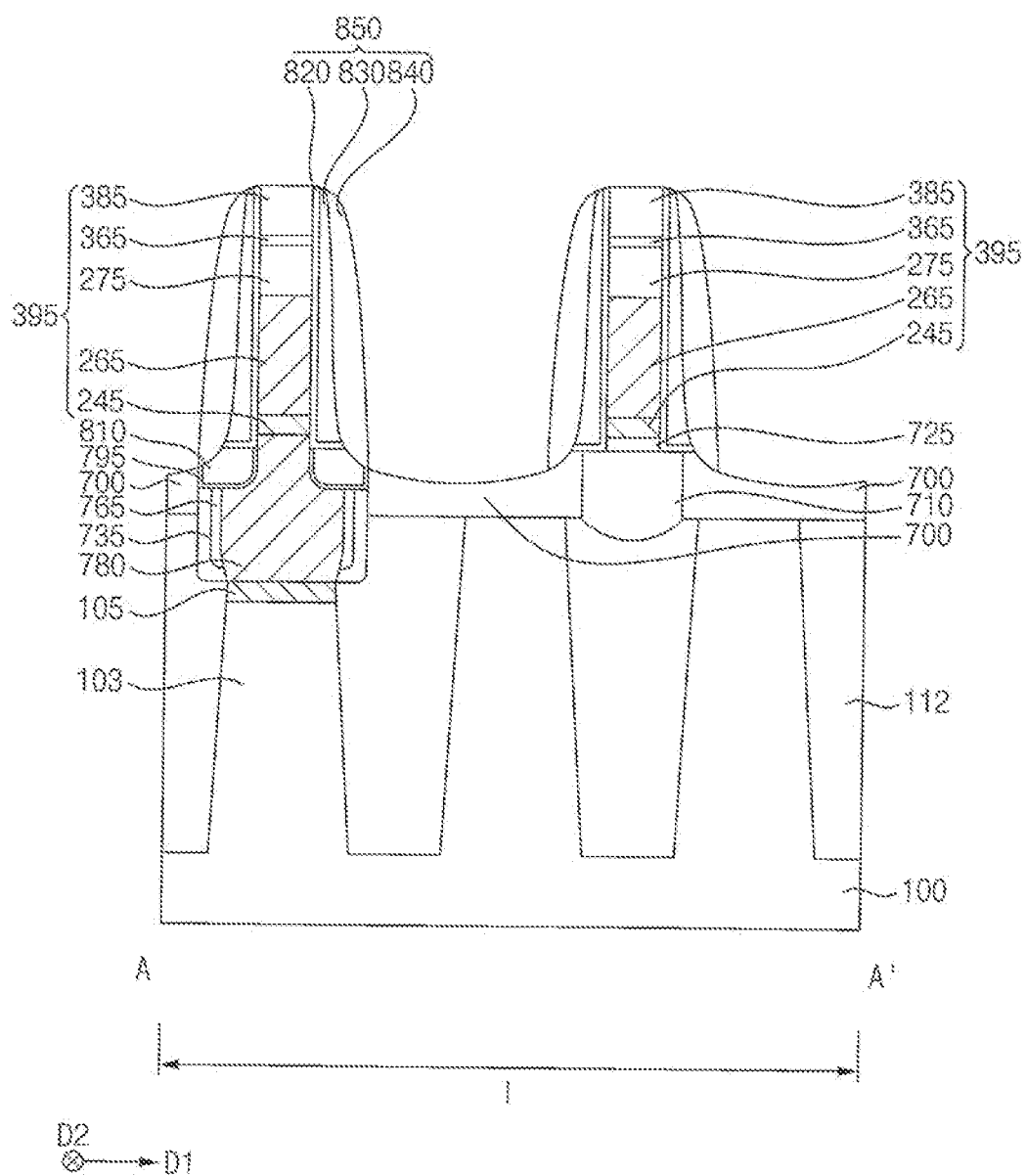

Referring to FIG. 20, first and second upper spacer layers may be sequentially formed on the substrate 100 on which the bit line structure 395, the first and second pads 700 and 710, the third pad pattern 725 and the first filling structure are formed, and the first and second upper spacer layers may be anisotropically etched to form first and second upper spacers 820 and 830. The first upper spacer 820 may be formed on and cover the sidewall of the bit line structure 395 and upper surfaces of portions of the second capping pattern 795 and the second filling pattern 810 included in the first filling structure, and the second upper spacer 830 may be formed on and cover an outer sidewall of the first upper spacer 820.

The first upper spacer 820 may include an insulating nitride, e.g., silicon nitride, and the second upper spacer 830 may include an oxide, e.g., silicon oxide.

A dry etching process may be performed using the bit line structure 395 and the first and second upper spacers 820 and 830 as an etching mask to form a fourth opening 440 partially exposing the upper surfaces of the first and second pads 700 and 710.

A third upper spacer layer may be formed on the upper surface of the first capping pattern 385, an upper surface of the first upper spacer 820, an upper surface and an outer sidewall of the second upper spacer 830, an upper surface of a portion of the first filling structure, and the upper surfaces of the portions of the first and second pads 700 and 710 exposed by the fourth opening 440, and the third upper spacer layer may be anisotropically etched to form a third upper spacer 840 formed on and covering the outer sidewall of the second upper spacer 830. The third upper spacer 840 may also cover the upper surface of the portion of the first filling structure. The third upper spacer 840 may include an insulating nitride, e.g., silicon nitride.

The first to third upper spacers 820, 830 and 840 sequentially stacked on the sidewall of the bit line structure 395 may form a preliminary upper spacer structure 850.

Figure 21:
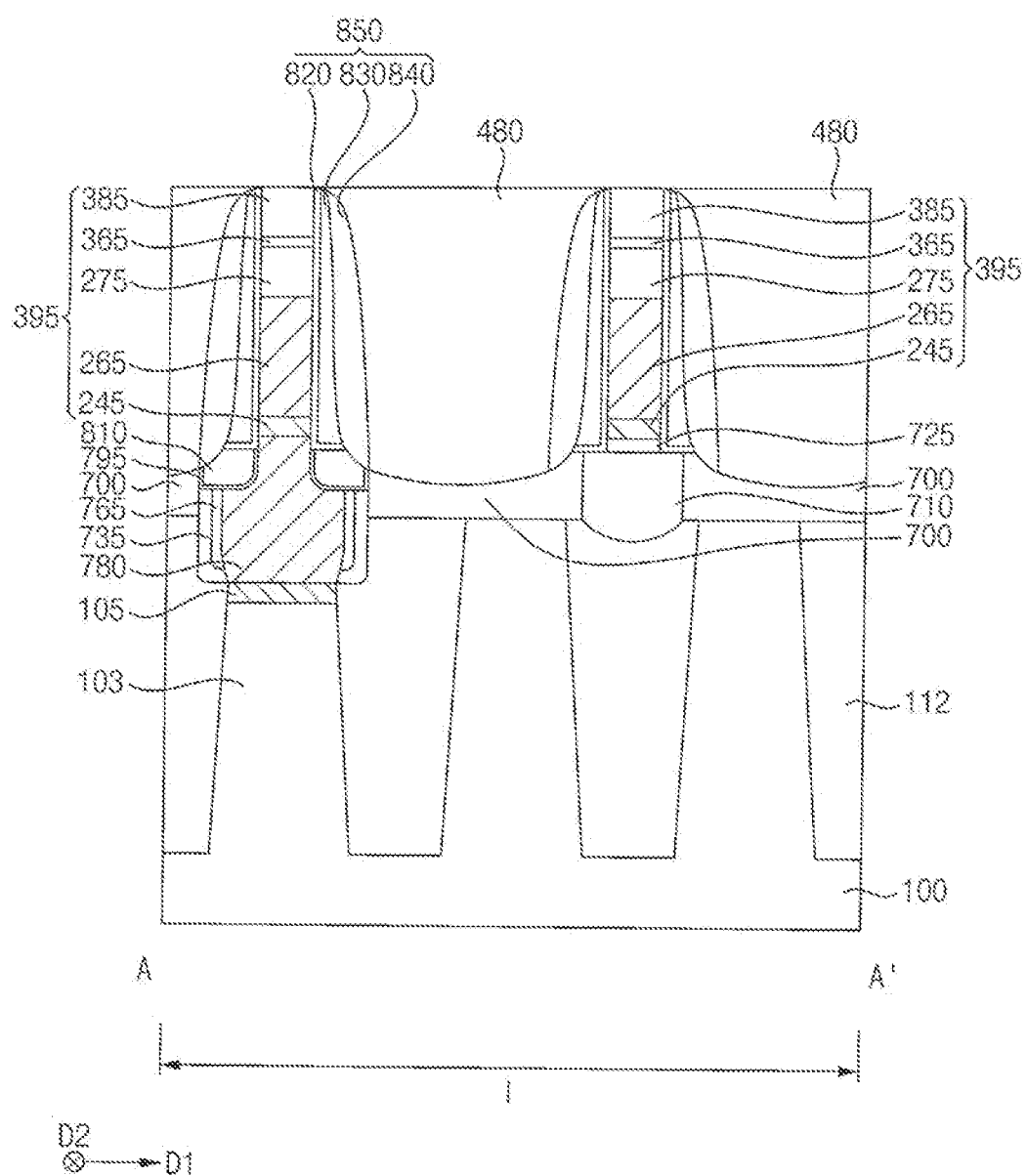

Referring to FIG. 21, a second sacrificial layer may be formed to a sufficient height to fill the fourth opening 440 on the substrate 100, and may be planarized until the upper surface of the first capping pattern 385 is exposed to form a second sacrificial pattern 480. In example embodiments, the second sacrificial pattern 480 may extend in the second direction D2, and a plurality of second sacrificial patterns 480 may be spaced apart from each other in the first direction D1 by the bit line structures 395. The second sacrificial pattern 480 may include an oxide, e.g., silicon oxide.

Figure 22:
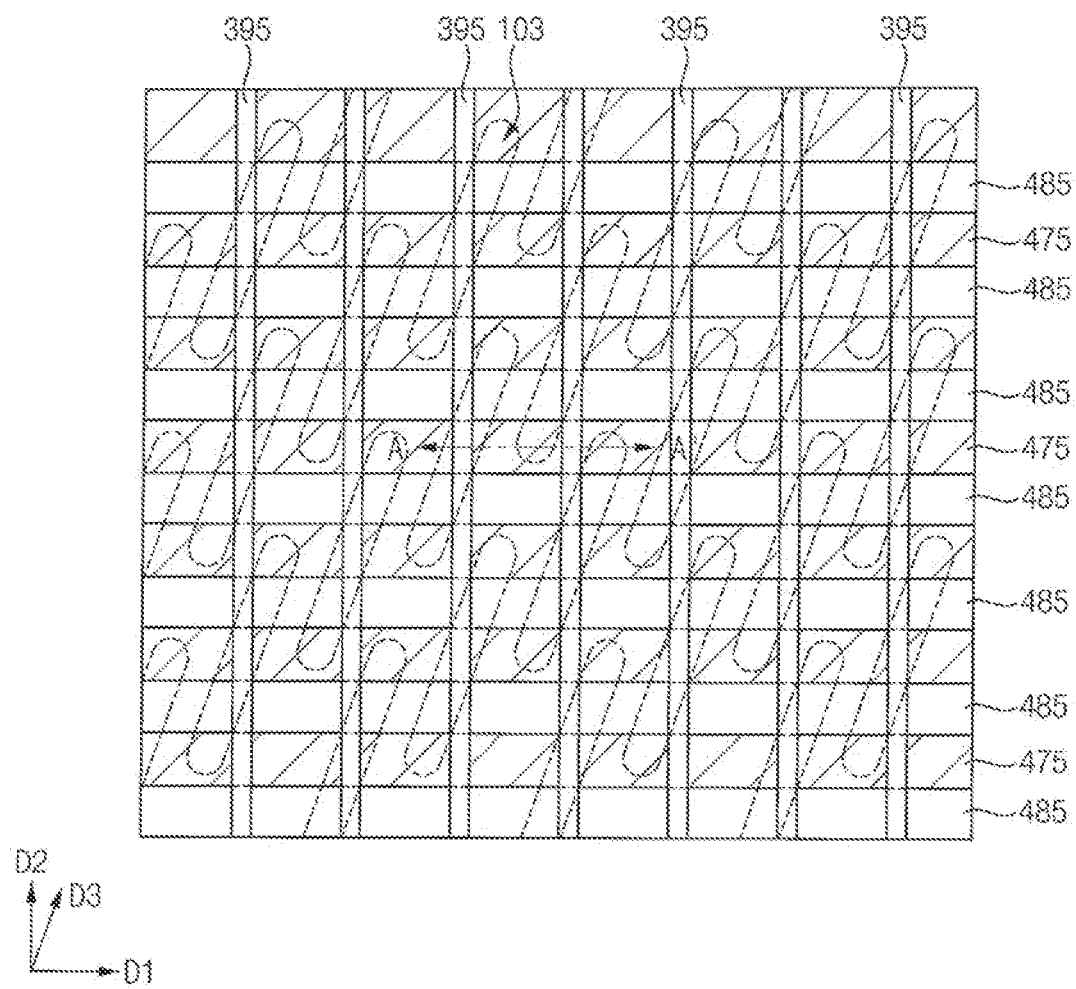
Figure 23:
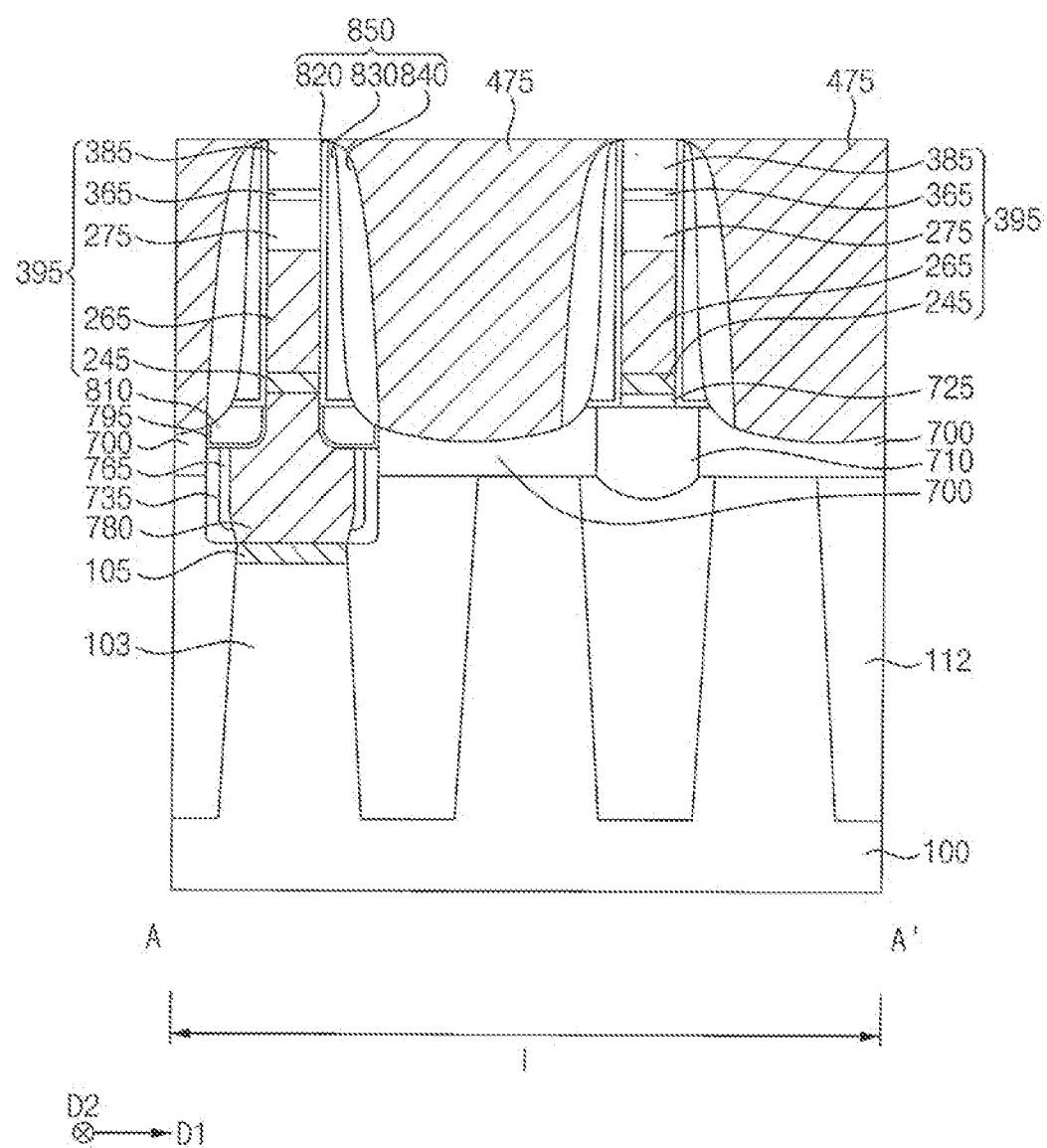

Referring to FIGS. 22 and 23, a second mask having a plurality of fifth openings spaced apart from each other in the second direction D2, each of which may extend in the first direction D1, may be formed on the first capping pattern 385, the second sacrificial pattern 480 and the preliminary upper spacer structure 850. The second sacrificial pattern 480 may be etched using the second mask as an etching mask to form a sixth opening exposing an upper surface of the gate mask 160 of the gate structure 170.

In example embodiments, each of the fifth openings may overlap the gate structure 170 in the vertical direction, and a plurality of the sixth openings may be spaced apart from each other in the second direction D2 between the bit line structures 395 neighboring in the first direction D1.

After removing the second mask, a third capping pattern 485 may be formed to fill the sixth openings. According to a layout of the sixth openings, a plurality of third capping patterns 485 may be spaced apart from each other in the second direction D2 between the bit line structures 395 neighboring in the first direction D1. The third capping pattern 485 may include an insulating nitride, e.g., silicon nitride.

The plurality of second sacrificial patterns 480 may be spaced apart from each other in the second direction D2 between the bit line structures 395.

The remaining second sacrificial pattern 480 may be removed to form a ninth opening partially exposing the upper surfaces of the first and second pads 700 and 710. A plurality of the seventh openings may be spaced apart from each other in the second direction D2 between the bit line structures 395 neighboring in the first direction D1.

A lower contact plug layer may be formed to a sufficient height to fill the seventh openings, and may be planarized until the upper surface the first capping pattern 385 and upper surfaces of the third capping pattern 485 and the preliminary upper spacer structure 850 are exposed. Accordingly, the lower contact plug layer may be divided into a plurality of lower contact plugs 475, which may be spaced apart from each other in the second direction D2 by the third capping patterns 485 between the bit line structures 395.

The lower contact plug 475 may include, e.g., doped polysilicon, and may be electrically connected to the active pattern 103 by contacting the first pad 700.

Figure 24:
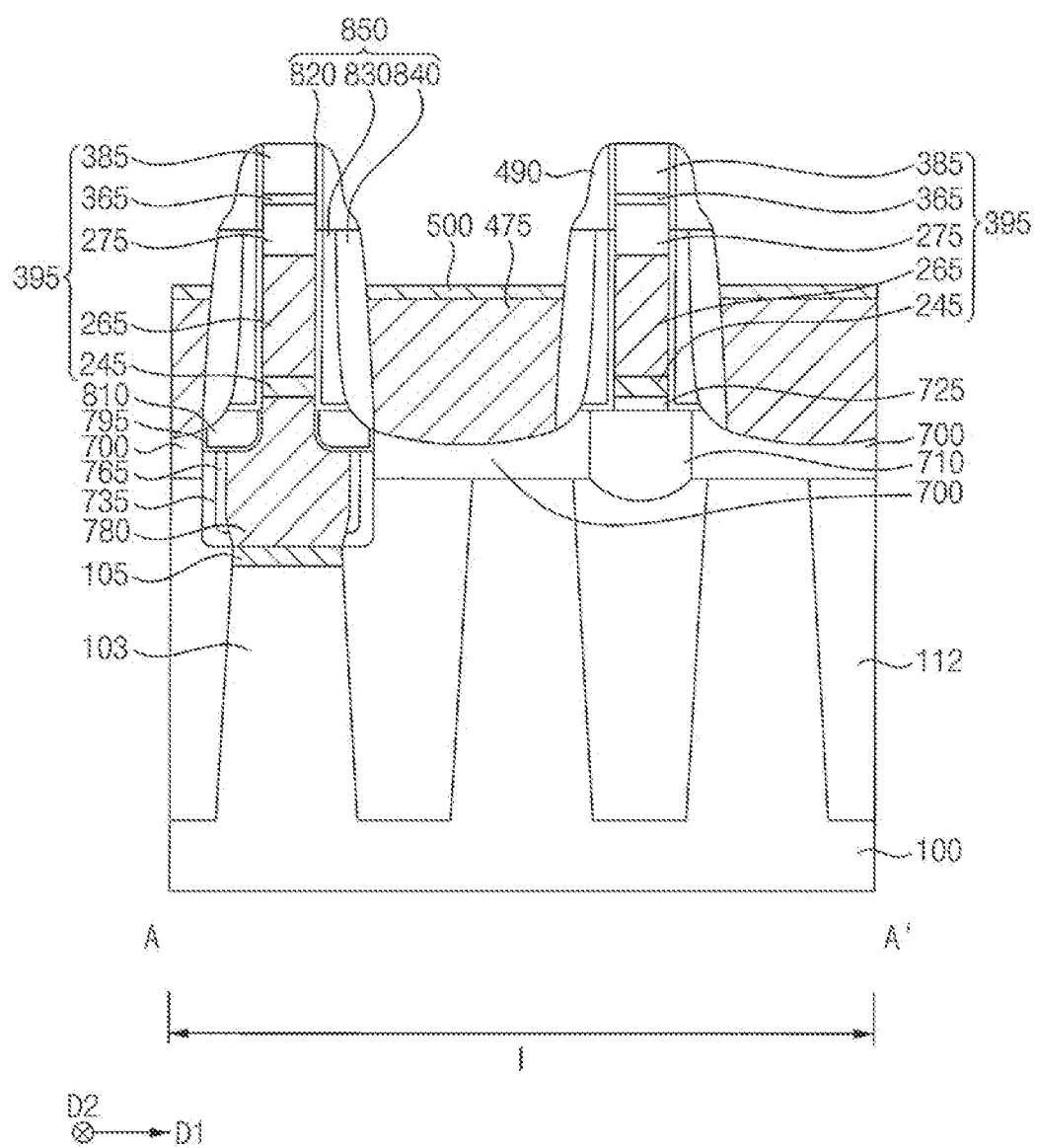

Referring to FIG. 24, an upper portion of the lower contact plug 475 may be removed to expose an upper portion of the preliminary upper spacer structure 850 on the sidewall of the bit line structure 395, and upper portions of the second and third upper spacers 830 of the exposed preliminary upper spacer structure 850 may be removed.

The upper portion of the lower contact plug 475 may be removed by, e.g., an etch back process, and the upper portions of the second and third upper spacers 830 and 840 may be removed by, e.g., a wet etching process.

A fourth upper spacer layer may be formed on the bit line structure 395, the preliminary upper spacer structure 850, the lower contact plug 475 and the third capping pattern 485, and may be anisotropically etched to form a fourth upper spacer 490. The fourth upper spacer may be formed on an outer sidewall of a portion of the first upper spacer 820 on an upper sidewall of the bit line structure 395.

The fourth upper spacer 490 that may be formed by the anisotropic etching process may be formed on and cover an upper surface of the second upper spacer 830 and at least a portion of an upper surface of the third upper spacer 840. Thus, during the anisotropic etching process, an upper portion of the lower contact plug 475 may be partially removed, and a portion of the third upper spacer 840 not covered by the fourth upper spacer 490 may also be removed.

In an example embodiment, a fifth upper spacer layer may be formed on the bit line structure 395, the first upper spacer 820, the fourth upper spacer 490, the lower contact plug 475 and the third capping pattern 485, and may be further etched to form a fifth upper spacer on a sidewall of the fourth upper spacer 490, and the upper portion of the lower contact plug 475 may be additionally etched using the bit line structure 395, the first upper spacer 820, the fourth upper spacer 490, the lower contact plug 475 and the third capping pattern 485 as an etching mask. Thus, an upper surface of the lower contact plug 475 may be lower than uppermost surfaces of the second and third upper spacers 830 and 840.

A second metal silicide pattern 500 may be formed on the upper surface of the lower contact plug 475. In example embodiments, the second metal silicide pattern 500 may be formed by forming a second metal layer on the bit line structure 395, the first upper spacer 820, the fourth upper spacer 490, the third upper spacer 840, the lower contact plug 475 and the third capping pattern 485, and performing a heat treatment on the second metal layer, that is, by performing a silicidation process in which the second metal layer including a metal and the lower contact plug 475 including silicon are reacted with each other, and removing an unreacted portion of the first metal layer.

The second metal silicide pattern 500 may include, e.g., cobalt silicide, nickel silicide, titanium silicide, etc.

Figure 25:
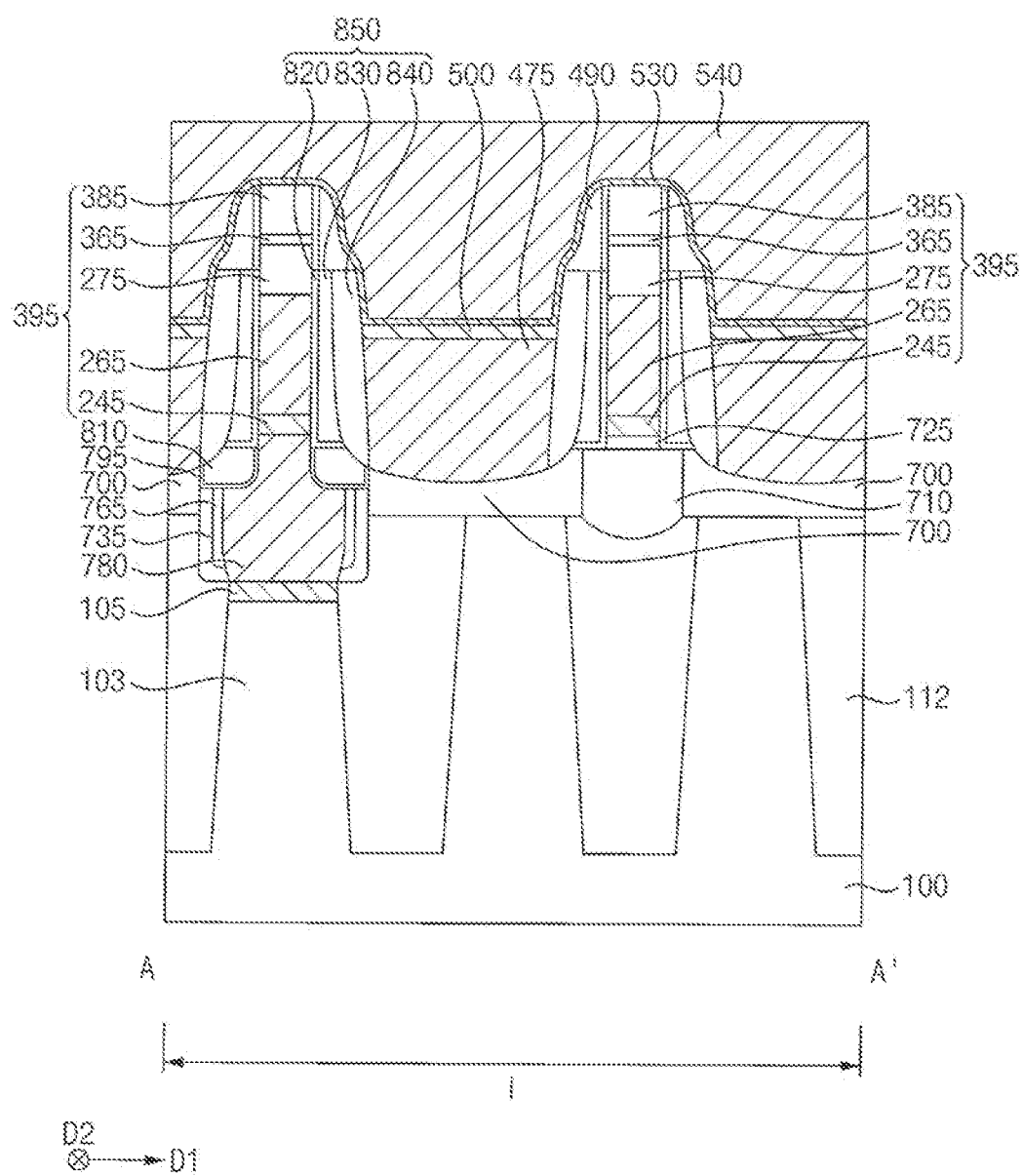

Referring to FIG. 25, a second barrier layer 530 may be formed on the bit line structure 395, the first upper spacer 820, the fourth upper spacer 490, the third upper spacer 840, the second metal silicide pattern 500 and the third capping pattern 485, and a third metal layer 540 may be formed on the second barrier layer 530 to fill a space between the bit line structures 395.

A planarization process may be performed on an upper portion of the third metal layer 540. The planarization process may include a CMP process and/or an etch back process.

Figure 26:
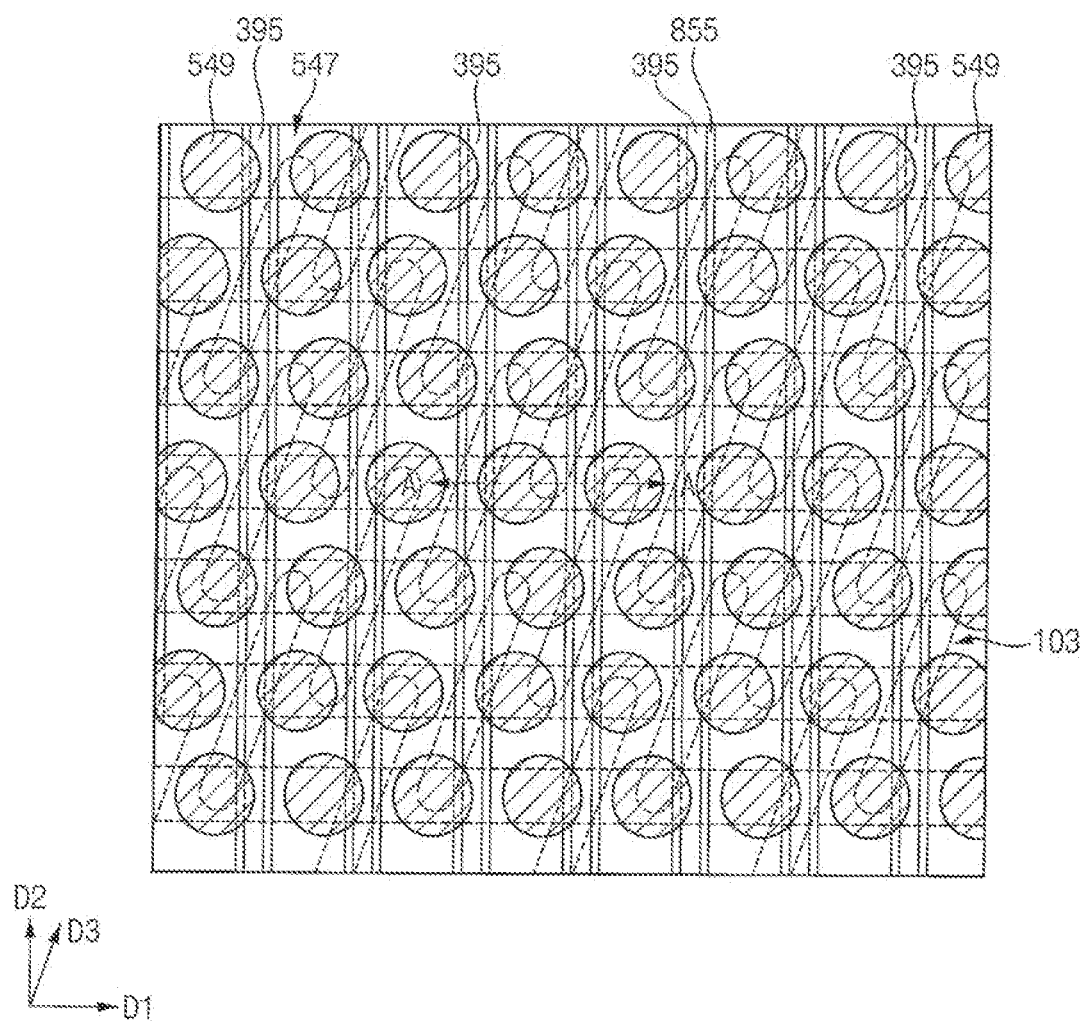
Figure 27:
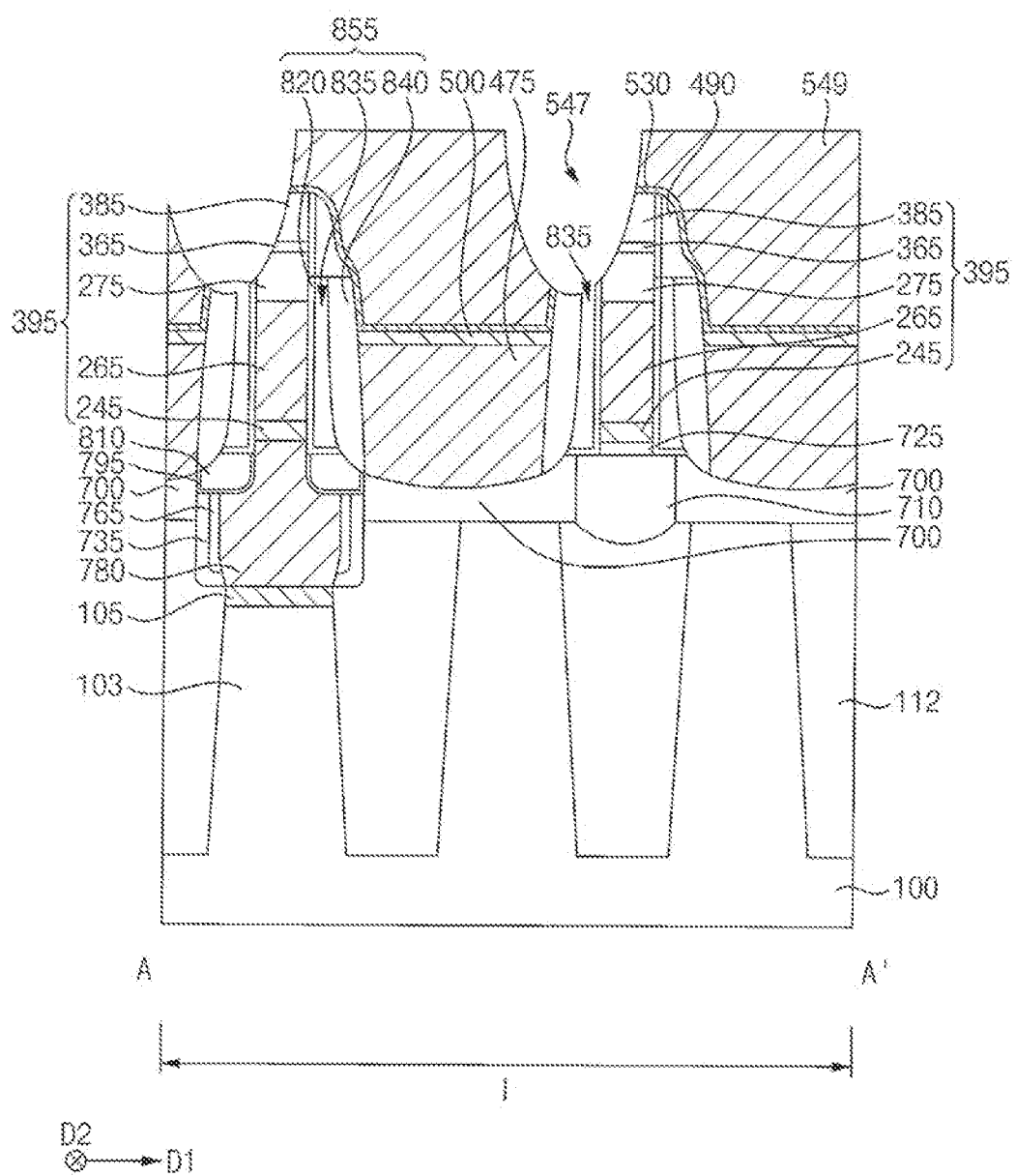

Referring to FIGS. 26 and 27, the third metal layer 540 and the second barrier layer 530 may be patterned to form an upper contact plug 549, and an eighth opening 547 may be formed between a plurality of upper contact plugs 549.

During the formation of the eighth opening 547, not only the third metal layer 540 and the second barrier layer 530 but also an upper portion of the insulation structure included in the bit line structure 395, the preliminary spacer structure 850 and the fourth spacer 490 on the sidewall thereof, and the third capping pattern 480 may also be partially removed, and thus an upper surface of the second spacer 830 may be exposed.

As the eighth opening 547 is formed, the third metal layer 540 and the second barrier layer 530 may be transformed, respectively, into a third metal pattern 545 and a second barrier pattern 535 formed on and covering a lower surface and a sidewall of the third metal pattern 545, which may form an upper contact plug 549. In example embodiments, the plurality of upper contact plugs 549 may be spaced apart from each other in the first and second directions D1 and D2, and may be arranged in a honeycomb pattern or a lattice pattern in a plan view. Each of the upper contact plugs 549 may have a shape of a circle, an ellipse, or a polygon.

The lower contact plug 475, the second metal silicide pattern 500 and the upper contact plug 549 sequentially stacked on the substrate 100 may form a contact plug structure.

The exposed second spacer 830 may be removed to form an air gap 835 connected with the eighth opening 547. The second spacer 830 may be removed by, e.g., a wet etching process.

In example embodiments, not only a portion of the second spacer 830 directly exposed by the eighth opening 547 but also a portion of the second spacer 830 parallel thereto may be removed. For example, not only the portion of the second spacer 830 exposed by the eighth opening 547 not to be covered by the upper contact plug 549 but also a portion of the second spacer 830 covered by the upper contact plug 549 may be removed.

Figure 28:
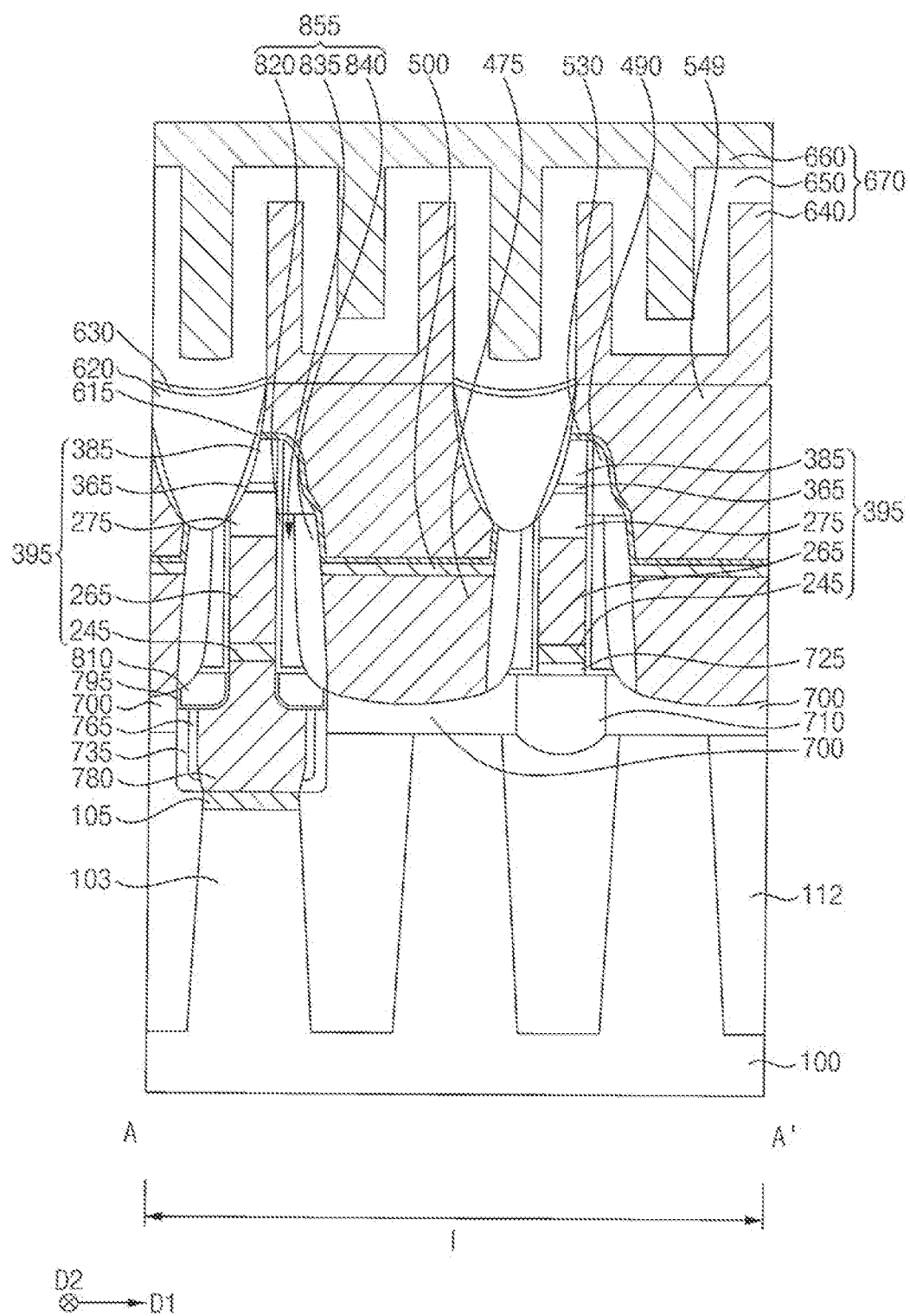

Referring to FIG. 28, a first insulation pattern 615 may be formed on a sidewall of the eight opening 547, and a second insulation pattern 620 may be formed on the first insulation pattern 615 to fill a remaining portion of the eight opening 547. Thus, a top end of the air gap 835 may be closed by the first and second insulation patterns 615 and 620.

The air gap 835 may also be referred as a second upper spacer 835, and the first, second, third upper spacers 835, 820 and 840 may form an upper spacer structure 855.

The first insulation pattern 615 may be formed by forming a first insulation layer on an inner wall of the eighth opening 547, the upper contact plug 549 and the third capping pattern 480, and anisotropically etching the first insulation layer.

The second insulation pattern 620 may be formed by forming a second insulation layer on the first insulation pattern 615, the upper contact plug 549 and the third capping pattern 480, and performing an etch back process on the second insulation layer.

Each of the first and second insulation patterns 615 and 620 may include a nitride, e.g., silicon nitride, and may form an insulation pattern structure.

A second etch stop layer 630 may be formed on the second insulation pattern 620, the upper contact plug 549 and the third capping pattern 480, and a mold layer may be formed on the second etch stop layer 630. A portion of the mold layer and a portion of the second etch stop layer 630 thereunder may be partially etched to form a ninth opening exposing an upper surface of the upper contact plug 549.

As the plurality of upper contact plugs 549 is spaced apart from each other in the first and second directions D1 and D2, and may be arranged in a honeycomb pattern or a lattice pattern in a plan view, the ninth openings exposing the upper contact plugs 549 may also be arranged in a honeycomb pattern or a lattice pattern in a plan view.

A lower electrode layer may be formed on a sidewall of the ninth opening, the exposed upper surface of the upper contact plug 549 and the mold layer, a third sacrificial layer may be formed on the lower electrode layer to fill the ninth opening, and the lower electrode layer and the third sacrificial layer may be planarized until an upper surface of the mold layer is exposed to divide the lower electrode layer into a plurality of parts.

Thus, a lower electrode 640 having a shape of a cylinder may be formed in the ninth opening. However, when the ninth opening has a relatively small width, the lower electrode 640 may have a shape of a pillar. The lower electrode 640 may include, e.g., a metal, a metal nitride, a metal silicide, doped polysilicon, etc.

The third sacrificial layer and the mold layer may be removed by, e.g., a wet etching process using, e.g., LAL solution.

A dielectric layer 650 may be formed on a surface of the lower electrode 640 and the second etch stop layer 630. The dielectric layer 650 may include, e.g., a metal oxide.

An upper electrode 660 may be formed on the dielectric layer 650. The upper electrode 660 may include, e.g., a metal, a metal nitride, a metal silicide, doped silicon-germanium, etc. In an example embodiment, the upper electrode 660 may have a first upper electrode including a metal or a metal nitride and a second upper electrode including doped silicon-germanium.

The lower electrode 640, the dielectric layer 650 and the upper electrode 660 may form a capacitor 670.

Upper wirings may be further formed on the capacitor 670 to complete the fabrication of the semiconductor device.

As described above, the first preliminary filling structure 790 formed in the second opening 230 may include the first preliminary lower spacer structure 770 on the sidewall of the first filling pattern 780. The first preliminary lower spacer structure 770 may include the second lower spacer 765 on the sidewall of the first filling pattern 780, and the first lower spacer 735 and the first sacrificial spacer 755 on the outer sidewall of the second lower spacer 765 that are stacked in the vertical direction.

In example embodiments, the third opening 420 may be formed by removing the first sacrificial spacer 755, and the upper portion of the second lower spacer 765 exposed by the third opening 420 may be removed. Thus, the width of the third opening 420 may be enlarged to exposed the upper portion of the first filling pattern 780, and the exposed upper portion of the first filling pattern 780 may be removed.

In example embodiments, when the first sacrificial spacer 755 is removed, the first lower spacer 735 under the first sacrificial spacer 755 may serve as the etch stop layer. Accordingly, depths of the third openings 420 in the respective second openings 230 may be substantially constant without large distribution.

For example, when the first sacrificial spacer 755 only is formed without separately forming the first lower spacer 735 and the first sacrificial spacer 755, an amount of removal of the first sacrificial spacer 755 depends on a process time. Accordingly, depths of the third openings 420 in the respective second openings 230 may have a very large distribution. However, in example embodiments, the first lower spacer 735 may serve as the etch stop layer, and hence the depths of the third openings 420 formed by removing the first sacrificial spacer 755 may have a very small distribution. Accordingly, an amount of removal of the first filling patterns 780 through the third openings 420 may be substantially constant within the second openings 230 so that the semiconductor device may have improved electrical characteristics.

In addition, the first sacrificial spacer 755 may include an oxide, e.g., silicon oxide, and the isolation pattern 112 on the sidewall of the active pattern 103 may also include substantially the same material as the first sacrificial spacer 755. Accordingly, when the first sacrificial spacer 755 only is formed without separately forming the first lower spacer 735, the amount of removal of the first sacrificial spacer 755 for forming the third opening 420 may not be properly controlled, and the first sacrificial spacer 755 may be excessively removed. Thus, the isolation pattern 112 contacting the first sacrificial spacer 755 may also be removed.

However, in example embodiments, the first lower spacer 735 including a material different from that of the first sacrificial spacer 755 may be additionally formed under the first sacrificial spacer 755, and the uppermost surface of the first lower spacer 735 may be higher than the upper surface of the isolation pattern 112 or the lower surface of the first pad 700. Thus, the first lower spacer 735, instead of the first sacrificial spacer 755, may contact the isolation pattern 112, and the isolation pattern 112 may not be removed when the third opening 420 is formed.

Furthermore, when compared to a case in which a triple layer is formed in the horizontal direction on the sidewall of the first filling pattern 780 in order to prevent the isolation pattern 112 from being removed when the third opening 420 is formed, the first preliminary lower spacer structure 770 according to the example embodiments may include a double layer in the horizontal direction, and a margin of space for forming the third opening 420 may be secured even when the size of the second opening 230 is reduced.

The semiconductor device manufactured by the above processes may have following structural characteristics.

Referring to FIGS. 26 and 28, the semiconductor device may include the active pattern 103 on the substrate 100, the isolation pattern 112 on the substrate 100 and covering the sidewall of the active pattern 103, the gate structure 170 extending in the first direction D1 and being in upper portions of the active pattern 103 and the isolation pattern 112, the conductive pad 700 on the active pattern 103 and the isolation pattern 112, the conductive contact plug 780 extending through the conductive pad 700, contacting a central upper surface in the third direction D3 of the active pattern 103, and including the lower portion having a first width and the upper portion having a second width less than the first width, the bit line structure 395 on the conductive contact plug 780 and the conductive pad 700 and extending a second direction D2, the second and first lower spacers 765 and 735 on the sidewall of the lower portion of the conductive contact plug 780 stacked in the horizontal direction and including different insulating materials from each other, the insulation filling pattern 810 on the first and second lower spacers 735 and 765; the upper spacer structure 855 on the insulation filling pattern 810 and covering the sidewall of the bit line structure 395, the contact plug structure 475, 500 and 549 on the conductive pad 700, and the capacitor 670 on the contact plug structure 475, 500 and 549. The uppermost surfaces of the first and second lower spacers may be substantially coplanar with the upper surface of the lower portion of the conductive contact plug 780.

In example embodiments, the second capping pattern 795 may be further formed to cover a sidewall of the upper portion of the conductive contact plug 780, the upper surface of the lower portion of the conductive contact plug 780, and the uppermost surfaces of the first and second lower spacers 735 and 765.

In example embodiments, the conductive contact plug 780 may be one of a plurality of conductive contact plugs 780 spaced apart from each other in the first and second directions D1 and D2, the first lower spacer 735 may be one of a plurality of first lower spacers 735 disposed in the first and second directions D1 and D2, and the second lower spacer 765 may be one of a plurality of second lower spacers 765 disposed in the first and second directions D1 and D2. The uppermost surfaces of the plurality of first lower spacers may be substantially coplanar with each other.

FIGS. 29 to 34 are cross-sectional views illustrating a method of manufacturing a semiconductor device in accordance with example embodiments. This method may include processes substantially the same as or similar to those illustrated with reference to FIGS. 1 to 28, and thus repeated explanations thereof are omitted herein.

Figure 29:
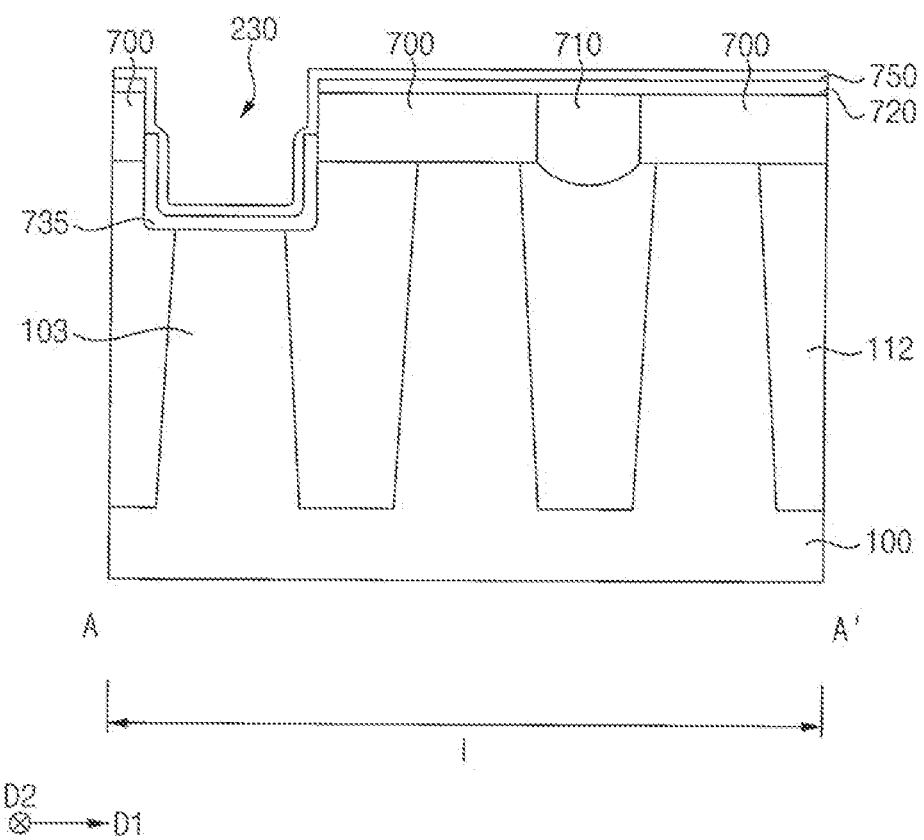
FIGS. 29 to 34 are cross-sectional views illustrating a method of manufacturing a semiconductor device in accordance with example embodiments.

Referring to FIG. 29, processes substantially the same as or similar to those illustrated with reference to FIGS. 1 to 8 may be performed, and the first sacrificial pattern 745 may be removed.

Accordingly, a surface of the first lower spacer 735 may be exposed, and a first sacrificial spacer layer 750 may be formed by, e.g., an ALD process on the exposed surface of the first lower spacer 735, the sidewall of the third recess 235 and the upper surface of the third pad 720.

Figure 30:
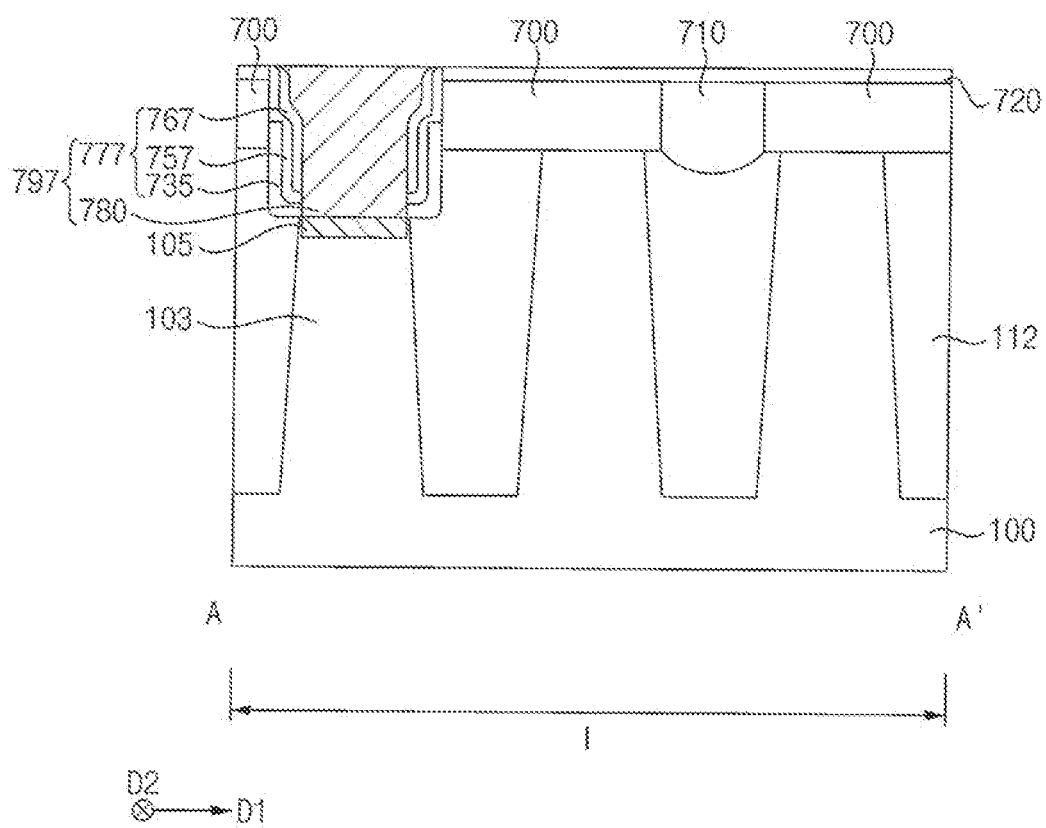

Referring to FIG. 30, a process substantially the same as or similar to those illustrated with reference to FIG. 11 may be performed, and a second preliminary filling structure 797 may be formed to fill the second opening 230.

The second preliminary filling structure 797 may include a second preliminary lower spacer structure 777 and the first filling pattern 780. The second preliminary lower spacer structure 777 may have the first lower spacer 735 on a lower sidewall and a bottom edge of the second opening 230, a fourth sacrificial spacer 757 on the surface of the first lower spacer 735 and an upper sidewall of the second opening 230, and a third lower spacer 767 on a sidewall of the fourth sacrificial spacer 757

Figure 31:
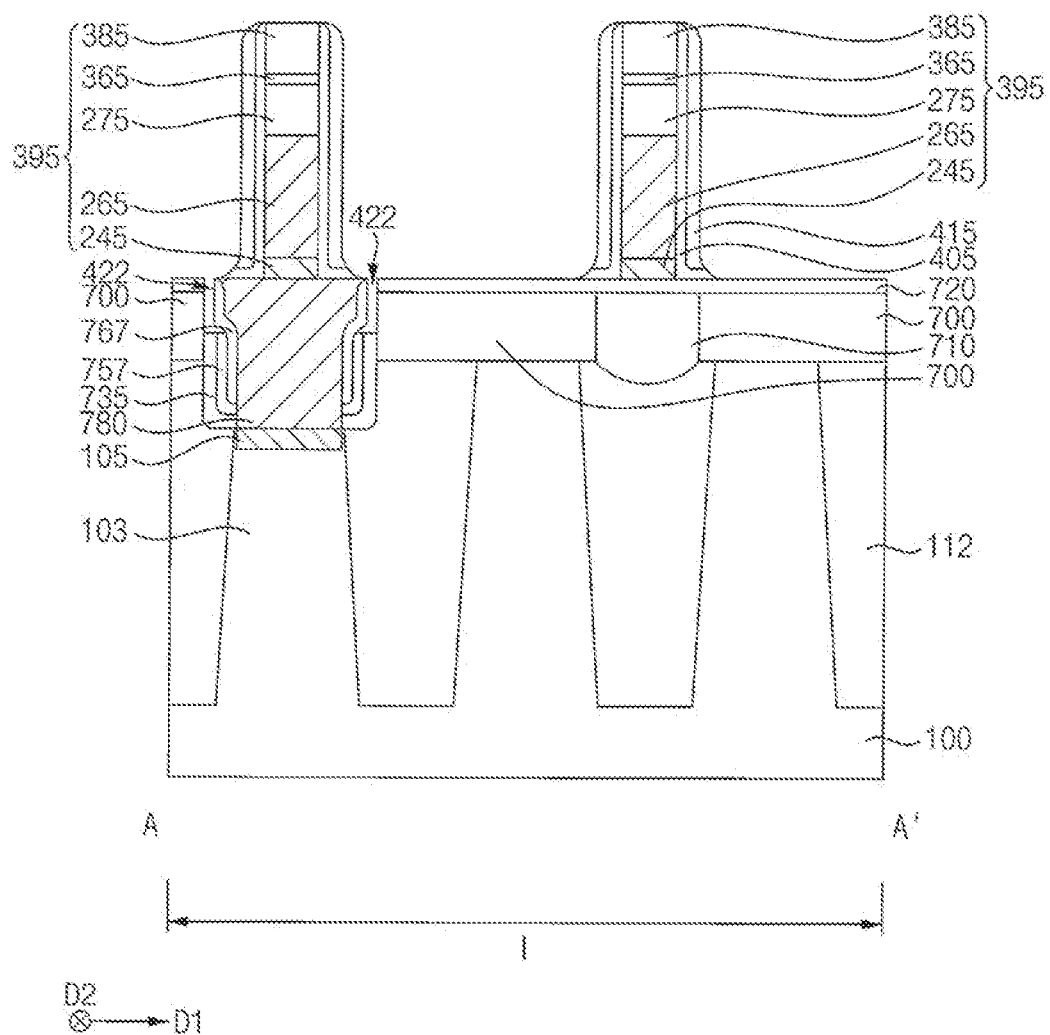

Referring to FIG. 31, processes substantially the same as or similar to those illustrated with reference to FIGS. 12 to 15 may be performed, and an upper portion of the fourth sacrificial spacer 757 may be removed to form a tenth opening 422.

In example embodiments, the upper portion of the fourth sacrificial spacer 757 may be removed by a wet etching process using, e.g., hydrofluoric acid (HF) as an etchant. The fourth sacrificial spacer 757 may have a relatively thin thickness at a height of the uppermost surface of the first lower spacer 735. Accordingly, during the wet etching process, it may be difficult for the etchant to penetrate into a lower portion of the fourth sacrificial spacer 757, and only the upper portion of the fourth sacrificial spacer 757 may be removed.

Accordingly, unlike the first sacrificial layer 755 illustrated with reference to FIG. 15, the first sacrificial spacer 755 may not be entirely removed and may partially remain. Hereinafter, the fourth sacrificial spacer 757 may be referred to as a fourth lower spacer 757.

Figure 32:
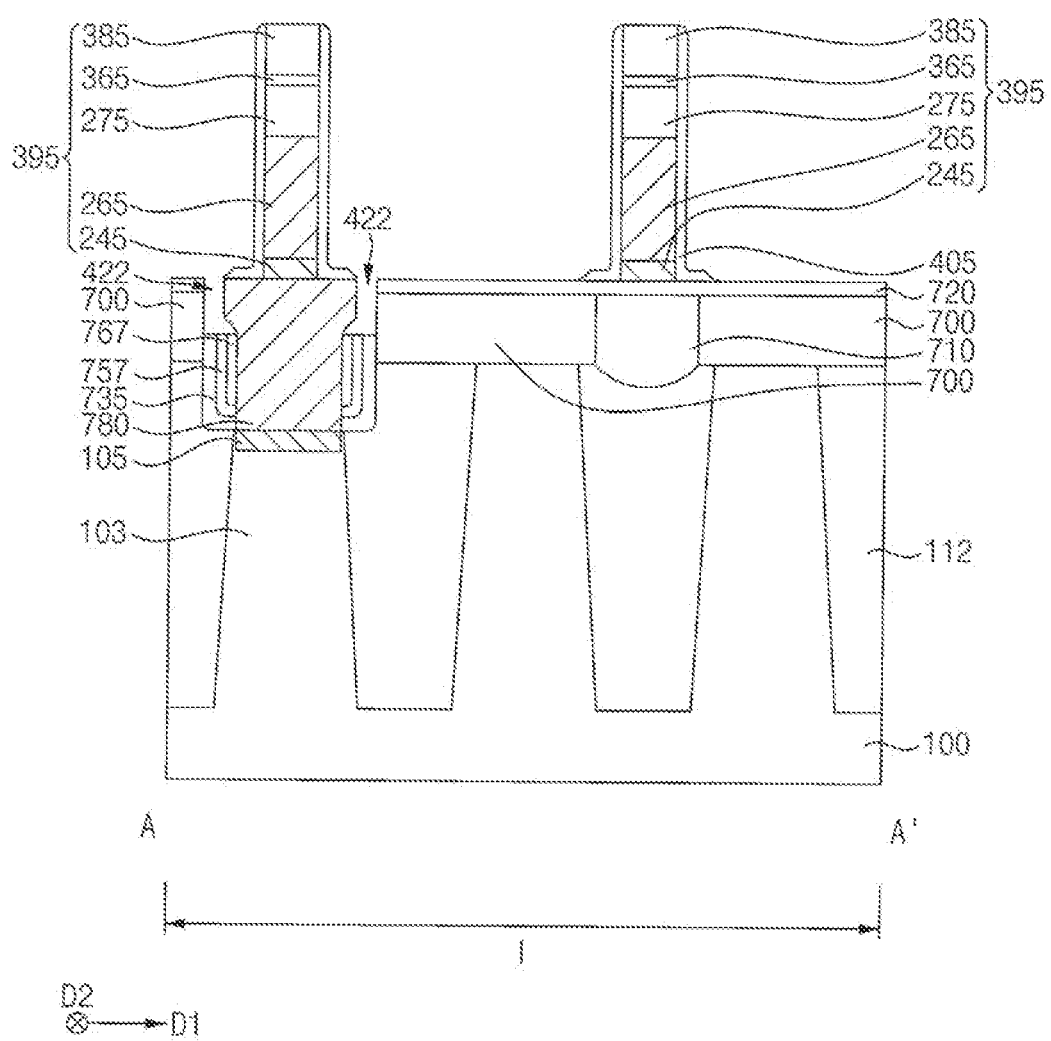

Referring to FIG. 32, processes substantially the same as or similar to those illustrated with reference to FIG. 16 may be performed, so that an upper portion of the third lower spacer 767 may be removed to enlarge a width of the tenth opening 422.

Figure 33:
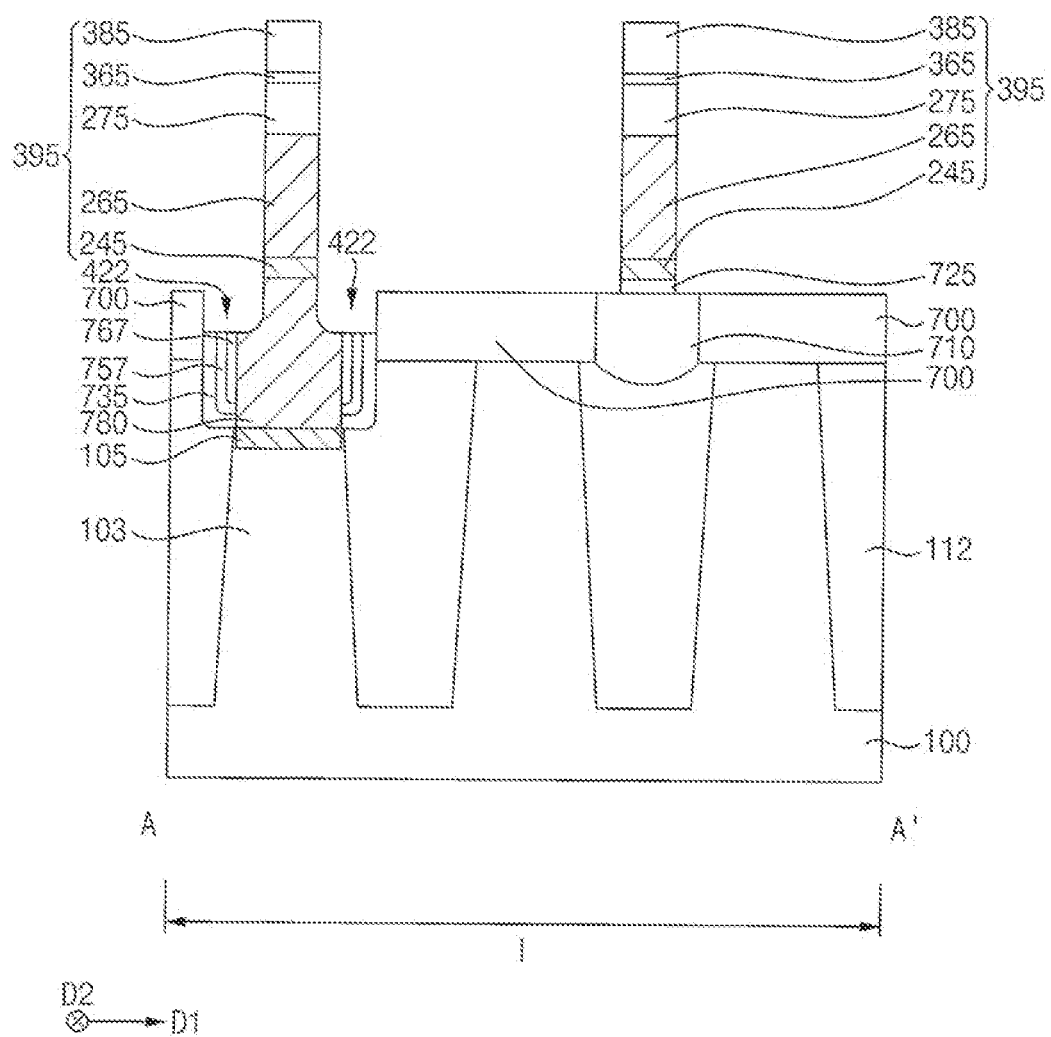

Referring to FIG. 33, processes substantially the same as or similar to those illustrated with reference to FIG. 17 may be performed, and the second sacrificial spacer 405 on the sidewall of the bit line structure 395 and a portion of the first filling pattern 780 not covered by the bit line structure 395 and exposed by the tenth opening 422 may be removed by an etching process.

Figure 34:
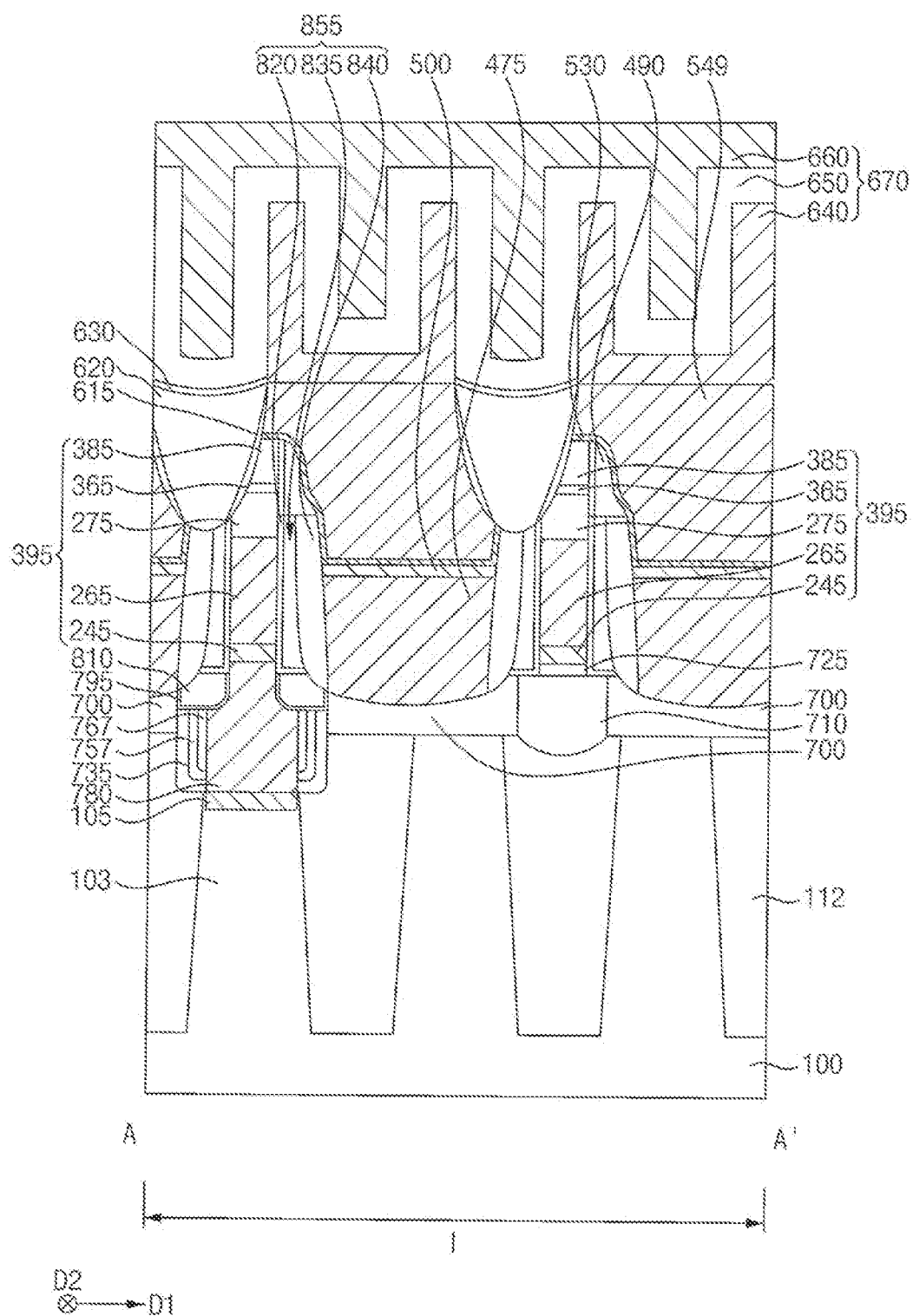

Referring to FIG. 34, processes substantially the same as or similar to those illustrated with reference to FIGS. 18 to 28 may be performed to complete the fabrication of the semiconductor device.

By performing the above described processes, the second filling structure including the first and second filling patterns 780 and 810, the first, third and fourth lower spacers 735, 767, and 757 and the second capping pattern 795 may be formed in the second opening 230. The first, third, and fourth lower spacers 735, 767 and 757 on a lower sidewall of the first filling pattern 780 may form a second lower spacer structure.

Unlike the semiconductor device illustrated in FIG. 28, the semiconductor device in FIG. 34 may include a second lower spacer structure having a triple layer containing the third, fourth and first lower spacers 767, 757 and 735. Accordingly, insulation between the first filling pattern 780 and the first pad 700 each of which may include a conductive material may be strengthened, and thus an electric short therebetween may be prevented.

In example embodiments, the uppermost surface of the first lower spacer 735 and uppermost surfaces of the third and fourth lower spacers 767 and 757 may be substantially coplanar with each other.

FIGS. 35 to 38 are cross-sectional views illustrating a method of manufacturing a semiconductor device in accordance with example embodiments. This method may include processes substantially the same as or similar to those illustrated with reference to FIGS. 29 to 34, and thus repeated explanations thereof are omitted herein.

Figure 35:
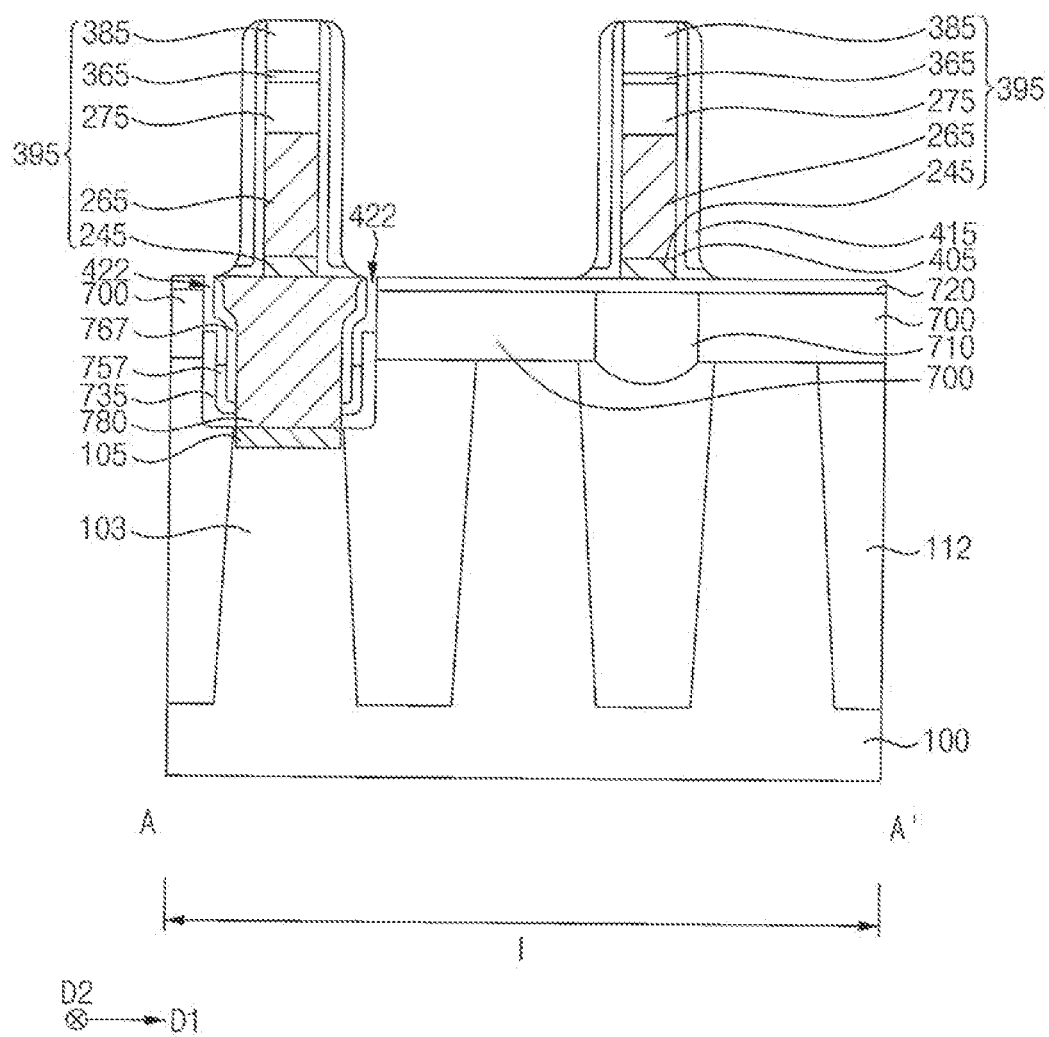
FIGS. 35 to 38 are cross-sectional views illustrating a method of manufacturing a semiconductor device in accordance with example embodiments.

Referring to FIG. 35, processes substantially the same as or similar to those illustrated with reference to FIGS. 29 to 31 may be performed, so that the tenth opening 422 may be formed by removing the upper portion of the fourth lower spacer 757.

When compared to the semiconductor device shown in FIG. 31, during the wet etching process, a portion of the fourth lower spacer 757 that is lower than the uppermost surface of the first lower spacer 735 as well as a portion that is higher than the uppermost surface of the first lower spacer 735 may be removed. However, the fourth lower spacer 757 may not be completely removed but may remain partially, and a portion of the etchant may penetrate into the portion of the fourth lower spacer 757 that is lower than the uppermost surface of the first lower spacer 735 during the wet etching process, and thus an uppermost surface of the remaining fourth lower spacer 757 may be lower than the uppermost surface of the first lower spacer 735.

Figure 36:
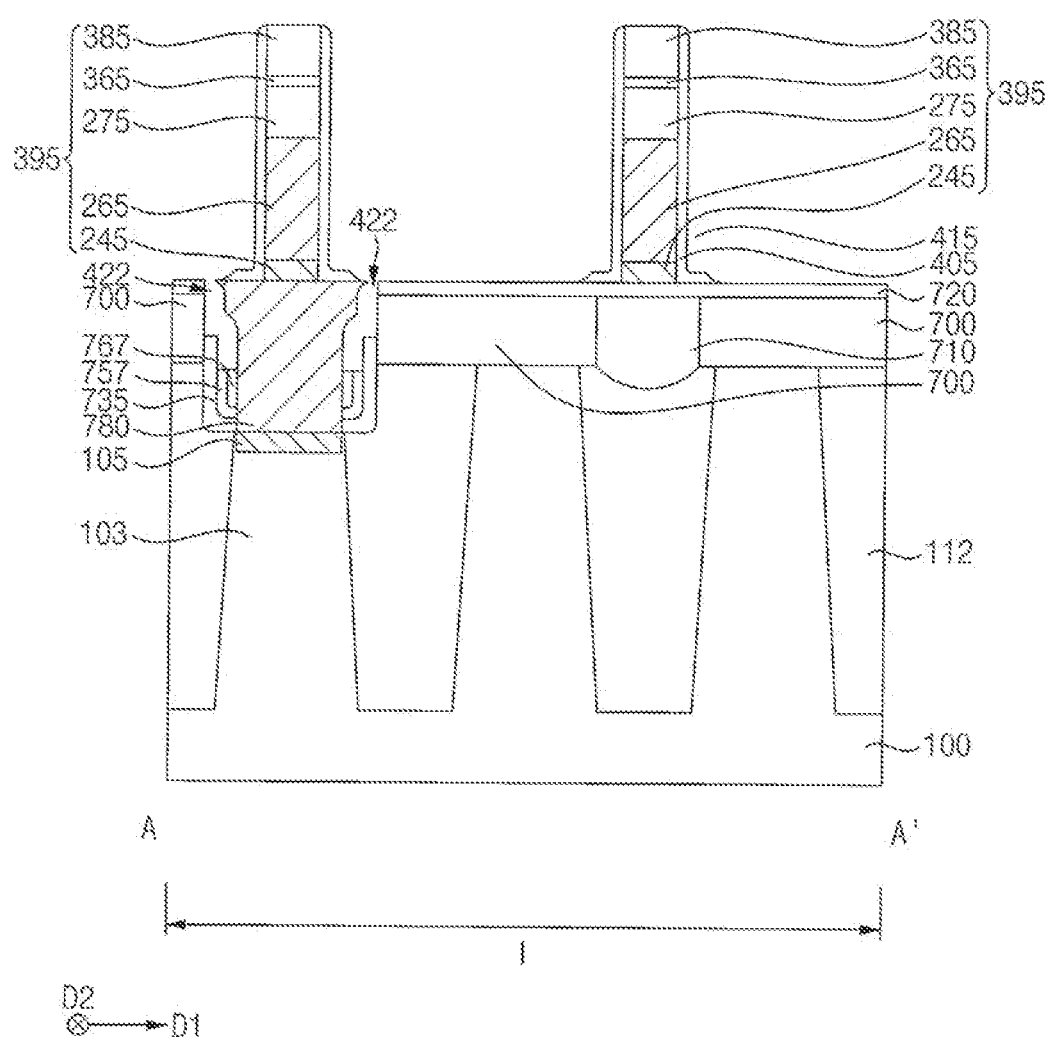

Referring to FIG. 36, processes substantially the same as or similar to those illustrated with reference to FIG. 32 may be performed, and a portion of the third lower spacer 767 exposed by the tenth opening 422 may be removed, and accordingly, a width of the tenth opening 422 may be enlarged.

A bottom of the tenth opening 422 may be lower than the uppermost surface of the first lower spacer 735, and hence the third lower spacer 767 may be removed more than that of the third lower spacer 767 of FIG. 32. An uppermost surface of the remaining third lower spacer 767 may be substantially coplanar with the uppermost surface of the fourth lower spacer 757, and thus may be lower than the uppermost surface of the first lower spacer 735.

Figure 37:
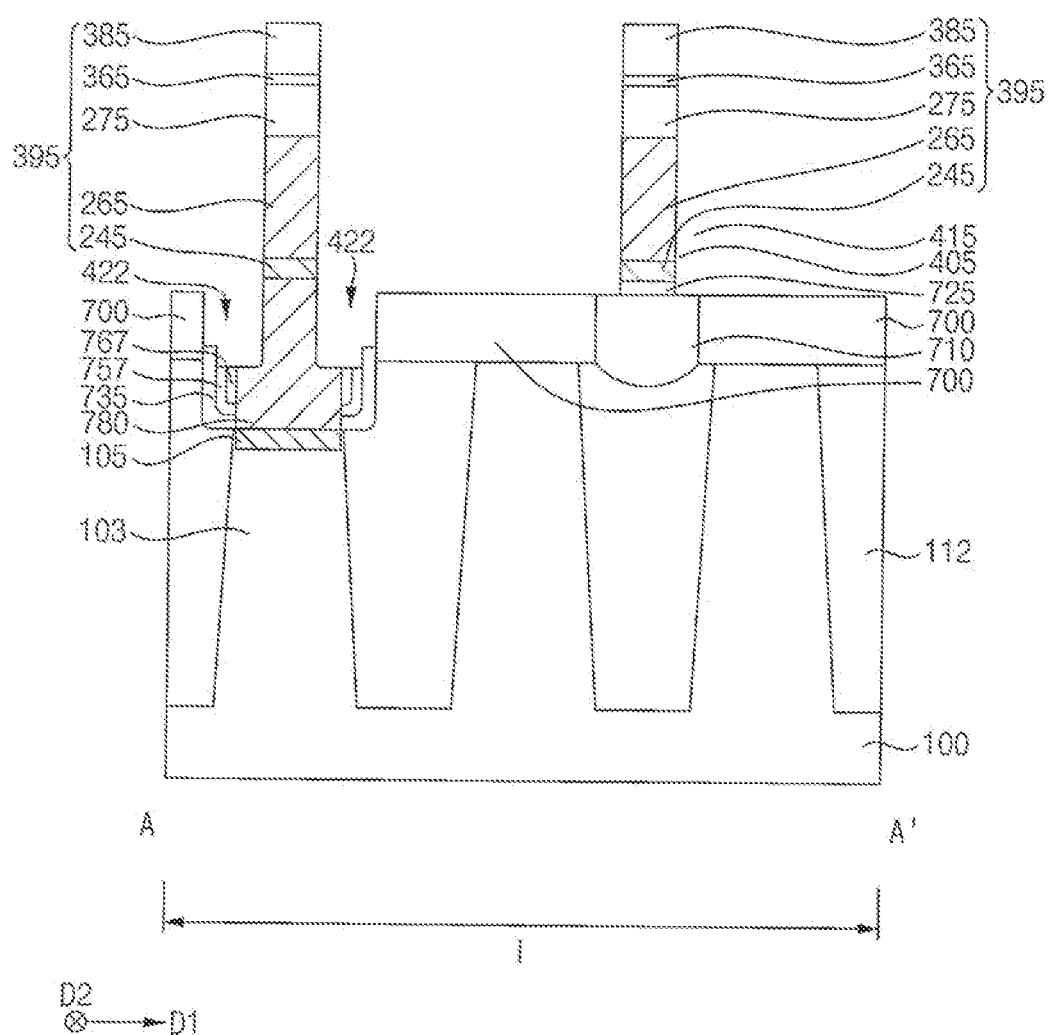

Referring to FIG. 37, a process substantially the same as or similar to those illustrated with reference to FIG. 33 may be performed, so that the second sacrificial spacer 405 on the sidewall of the bit line structure 395 and the portion of the first filling pattern 780 not covered by the bit line structure 395 and exposed by the tenth opening 422 may be removed by an etching process.

The first filling pattern 780 may include the lower portion having the relatively large width and the upper portion having the relatively small width, and the upper surface of the lower portion of the first filling pattern 780 may be substantially coplanar with the uppermost surfaces of the third and fourth lower spacers 767 and 757 and lower than the uppermost surface of the first lower spacer 735.

Figure 38:
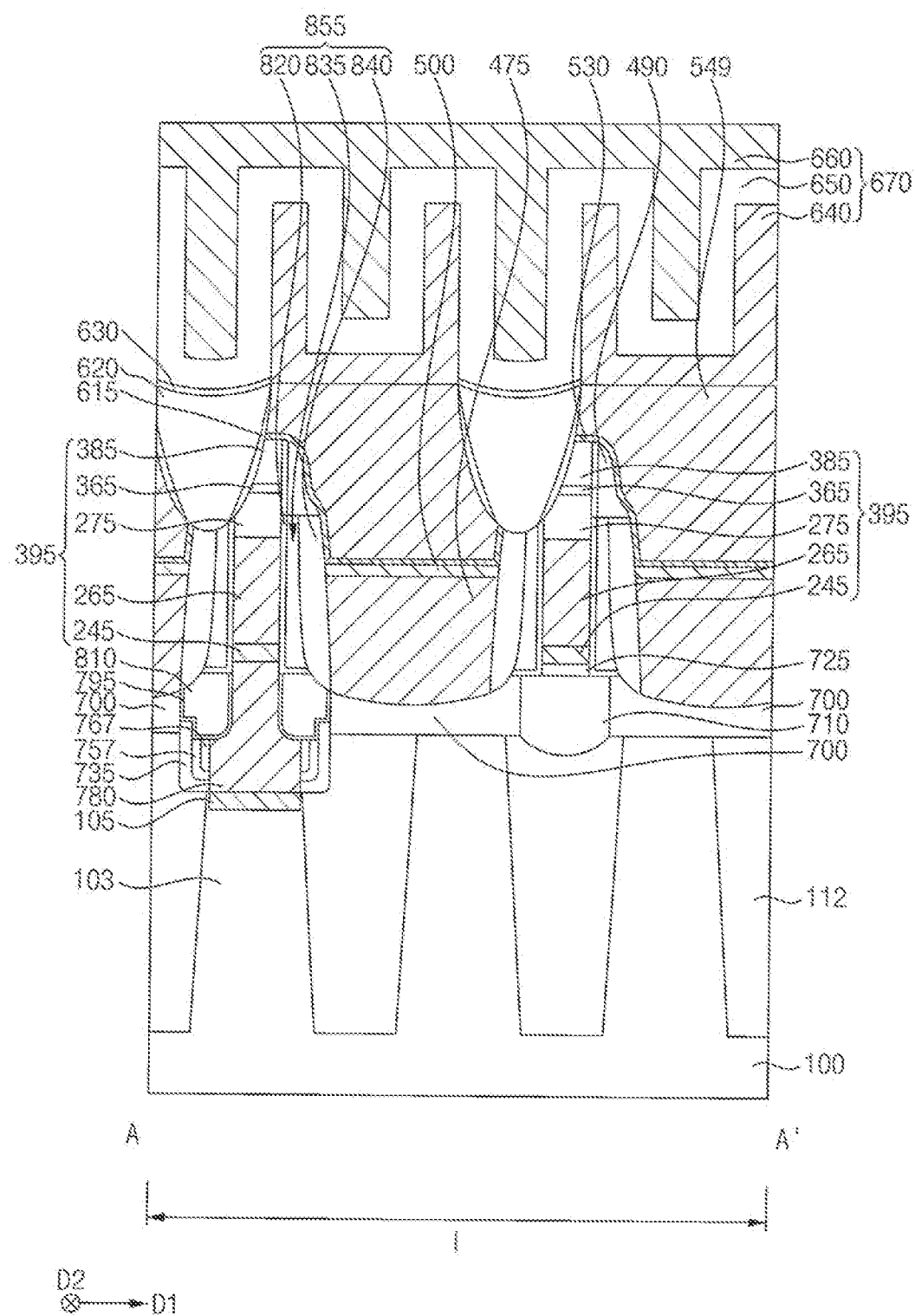

Referring to FIG. 38, processes substantially the same as or similar to those illustrated with reference to FIG. 34 may be performed to complete the fabrication of the semiconductor device.

Figure 39:
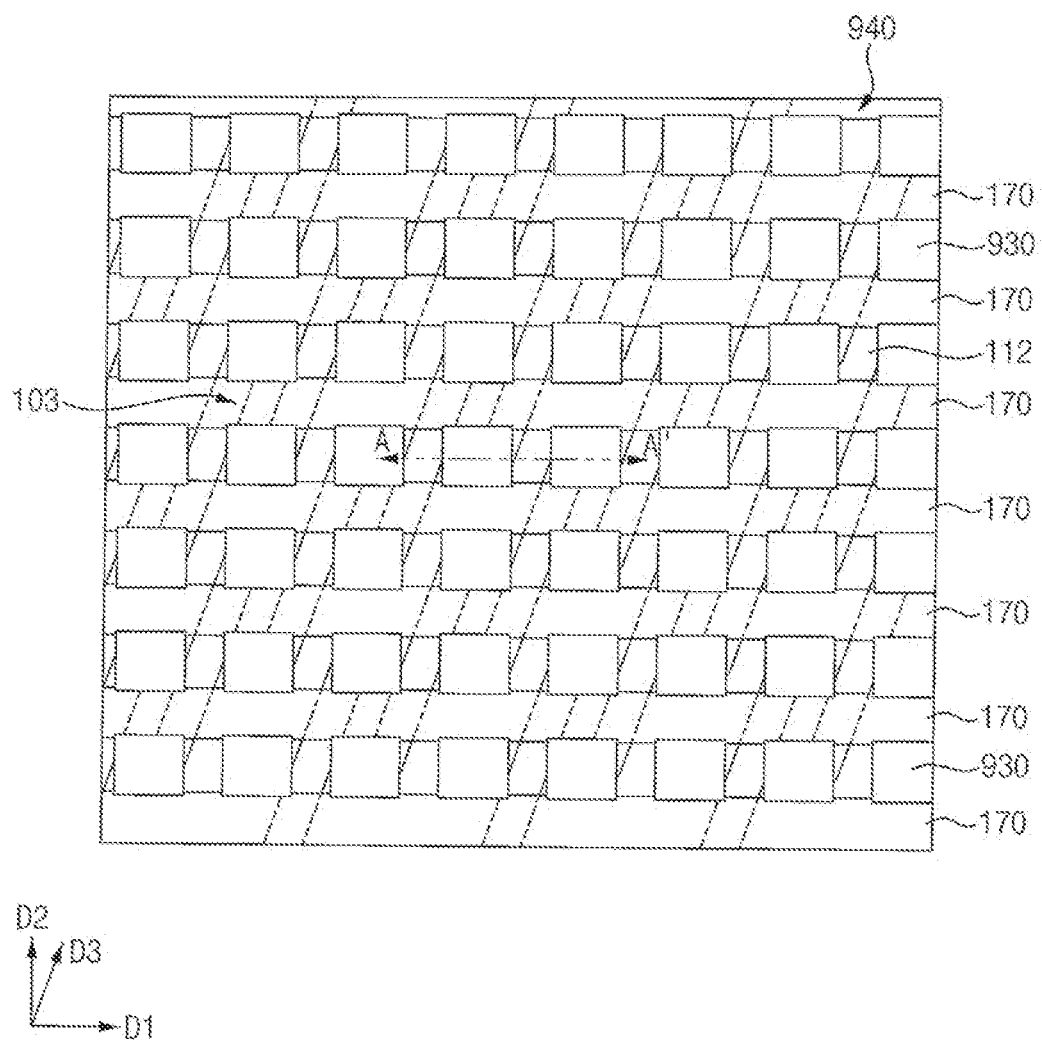
FIGS. 39 to 45 are cross-sectional views illustrating a method of manufacturing a semiconductor device in accordance with example embodiments.
Figure 40:
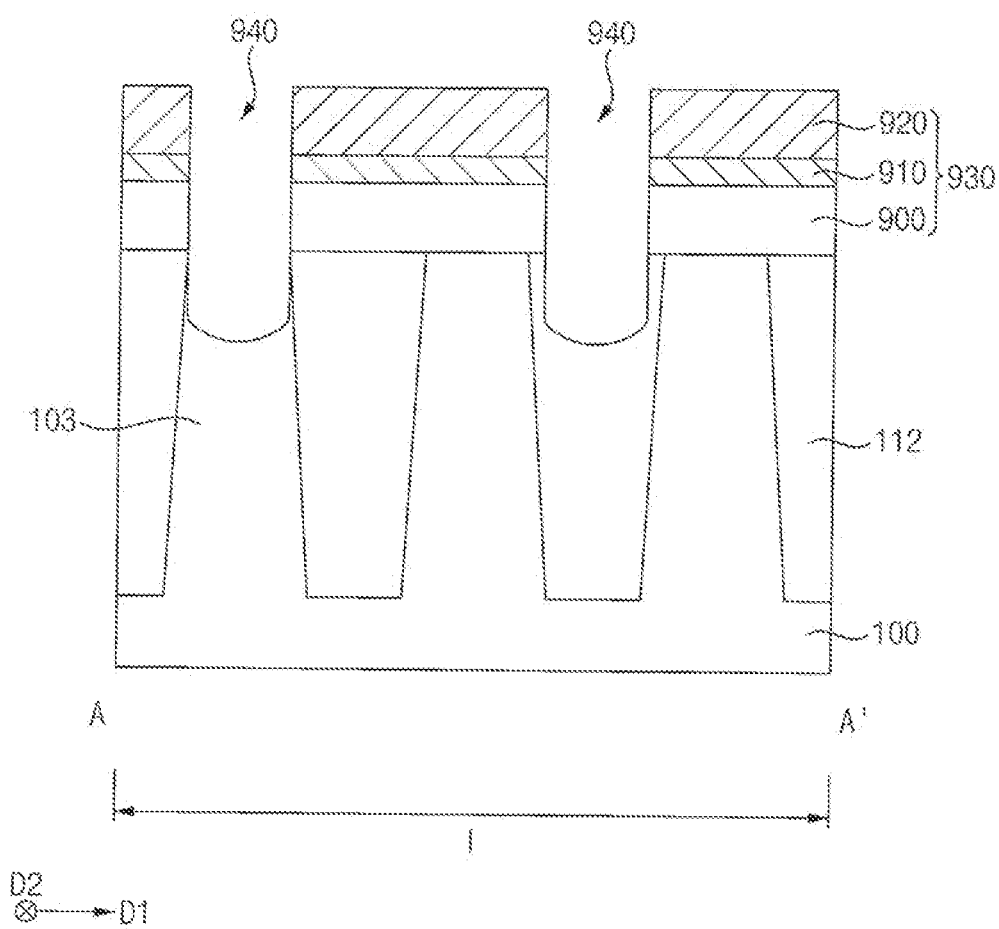
Figure 41:
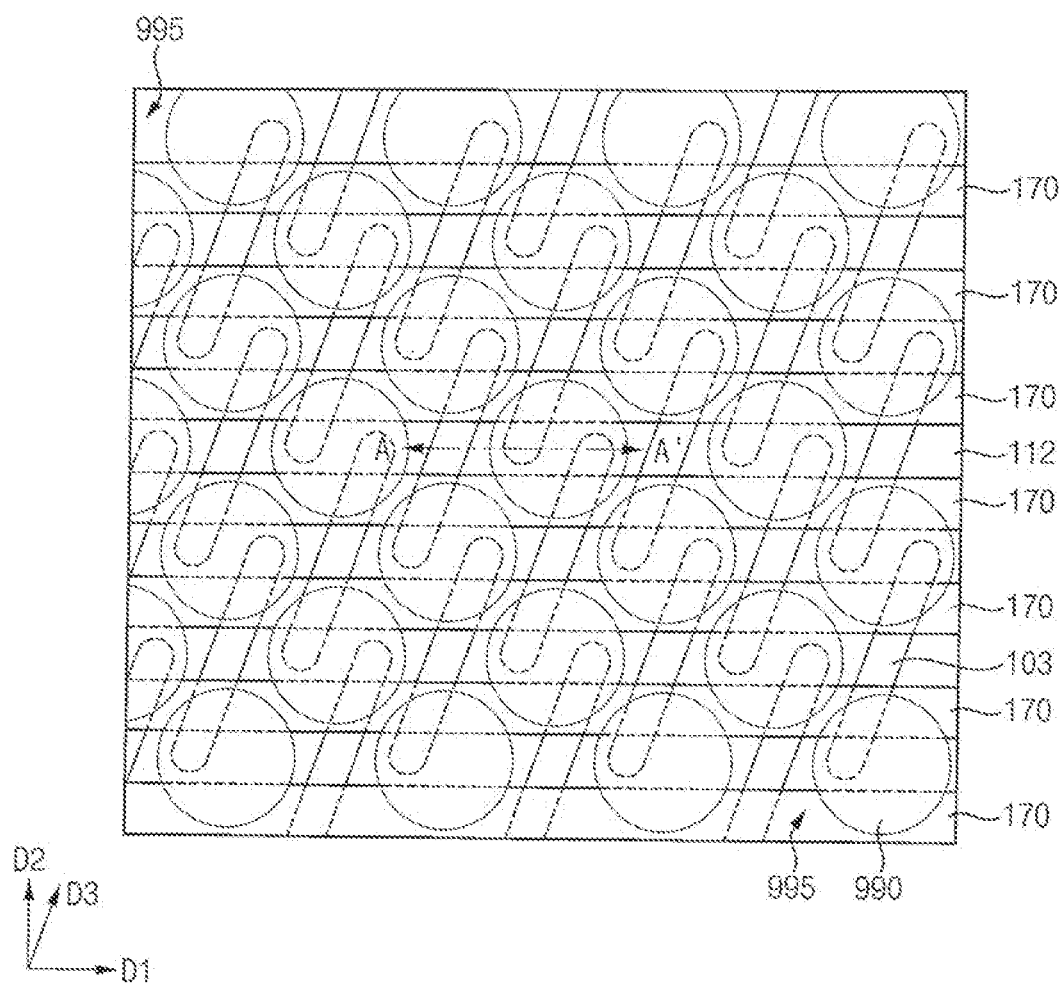

FIGS. 39 to 45 are plan views and cross-sectional views illustrating a method of manufacturing a semiconductor device in accordance with example embodiments. Particularly, FIGS. 39 and 41 are the plan views, and FIG. 40 and FIGS. 42 to 45 are cross-sectional views taken along lines A-A' of corresponding plan views, respectively. This method may include processes substantially the same as or similar to those illustrated with reference to FIGS. 1 to 28, and thus repeated explanations thereof are omitted herein.

Referring to FIGS. 39 and 40, processes substantially the same as or similar to those illustrated with reference to FIGS. 1 to 2 may be performed, and the active pattern 103 and the isolation pattern 112 may be formed on the substrate 100.

A conductive pad structure 930 may be formed on the active pattern 103 and the isolation pattern 112.

The conductive pad structure 930 may include a fourth pad 900, a fifth pad 910, and a sixth pad 920 sequentially stacked in the vertical direction. In example embodiments, the fourth pad 900 may include, e.g., doped polysilicon, the fifth pad 910 may include e.g., a metal silicide such as titanium silicide, cobalt silicide, nickel silicide, etc., a metal nitride such as titanium nitride, tantalum nitride, tungsten nitride, etc., or a metal silicon nitride such as titanium silicon nitride, tantalum silicon, etc., and the sixth pad 920 may include a metal such as tungsten, ruthenium, etc. For example, when compared to the first pad 700 in FIGS. 3 and 4 having a single layer structure, the conductive pad structure 930 may be a multi-layer structure.

The conductive pad structure 930 may be patterned by an etching process to form an eleventh opening 940 exposing the upper surfaces of the active pattern 103, the isolation pattern 112, and the gate structure 170, and upper portions of the active pattern 103 and the isolation pattern 112 may also be partially removed during the etching process.

The eleventh opening 940 may have a layout corresponding to the first opening illustrated with reference to FIGS. 3 and 4. The eleventh opening 940 may include a first portion extending in the first direction D1 and a second portion extending in the second direction D2, which may be connected with each other. A plurality of eleventh openings 940 may be spaced apart from each other in the first and second directions D1 and D2, and may be arranged in a lattice pattern.

In example embodiments, the conductive pad structure 930 may overlap in the vertical direction the end portion of each active pattern 103 extending in the third direction D3 and the portion of the isolation pattern 112 adjacent thereto in the first direction D1.

Figure 42:
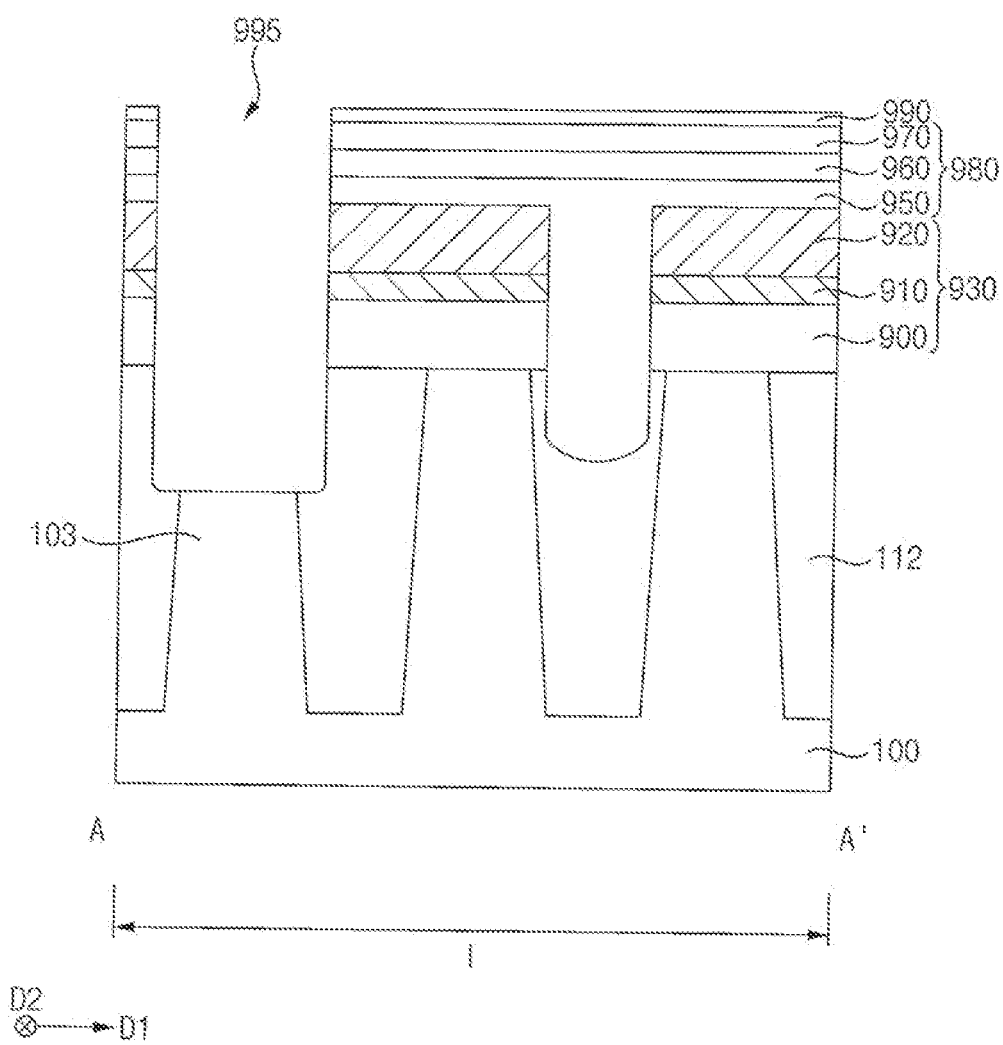

Referring to FIGS. 41 and 42, an insulating pad layer structure 980 may be formed on the conductive pad structure 930 to fill the eleventh opening 940.

In example embodiments, the insulating pad layer structure 980 may include a seventh pad layer 950, an eighth pad layer 960, and a ninth pad layer 970 sequentially stacked, and the seventh pad layer 950 may fill the eleventh opening 940. In example embodiments, the seventh and ninth pad layers 950 and 970 may include an insulating nitride, e.g., silicon nitride, and the eighth pad layer 960 may include a metal oxide, e.g., hafnium oxide, zirconium oxide, etc.

A tenth pad layer may be formed on the insulating pad layer structure 980, and patterned to form a tenth pad 990. The insulating pad layer structure 980, the conductive pad structure, the active pattern 103, the isolation pattern 112 and the gate mask 160 included in the gate structure 170 may be partially etched by using the tenth pad 990 as an etching mask to form a twelfth opening 995.

The twelfth opening 995 may have a layout corresponding to the second opening 230 illustrated with reference to FIGS. 5 and 6. For example, a tenth pad 990 may have a shape of a circle or an ellipse in a plan view, and a plurality of tenth pads 990 may be formed to be spaced apart from each other in the first and second directions D1 and D2. Each of the tenth pads 990 may overlap in the vertical direction the end portions of the active patterns 103 neighboring in the first direction D1 and the portion of the isolation pattern 112 between the end portions of the active patterns 103.

Figure 43:
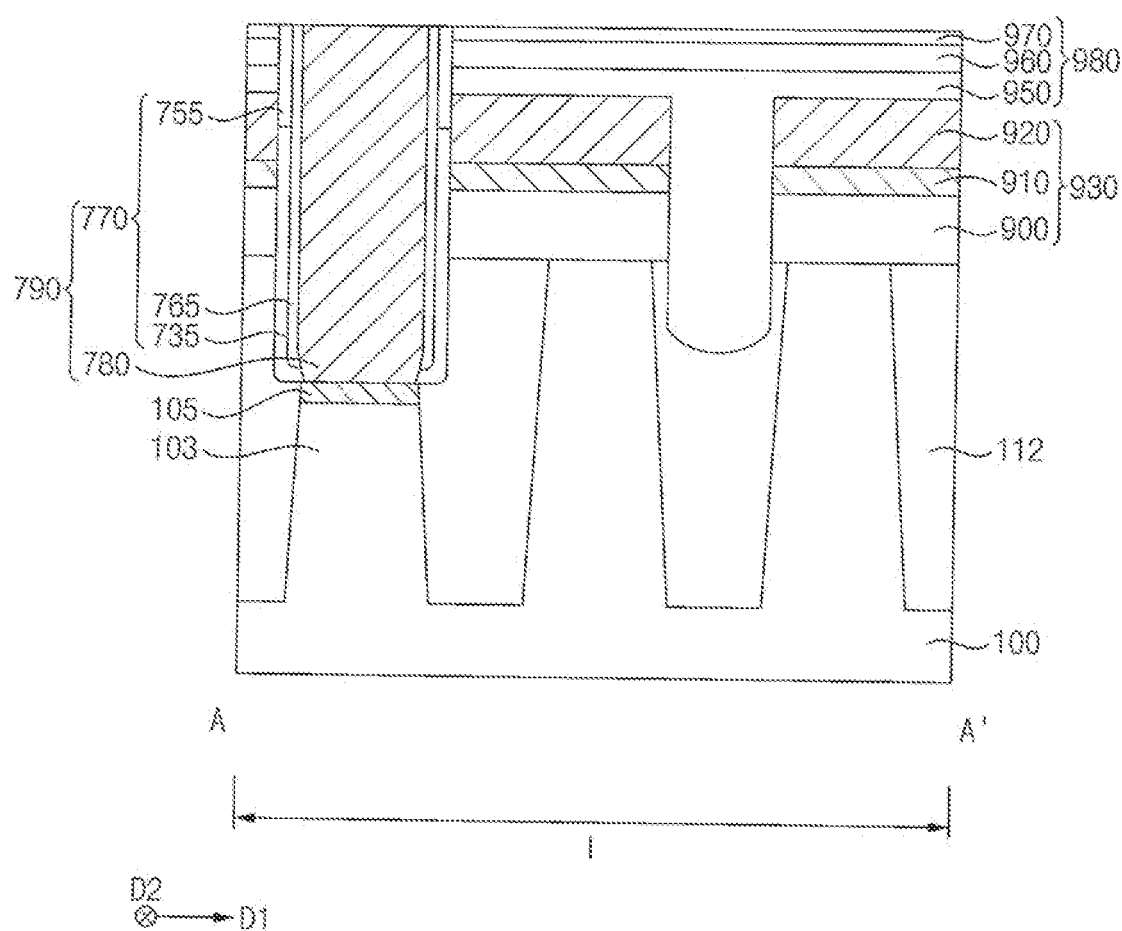

Referring to FIG. 43, processes substantially the same as or similar to those illustrated with reference to FIGS. 7 to 11 may be performed, so that the first preliminary filling structure 790 may be formed to fill the twelfth opening 995.

In an example embodiment, the uppermost surface of the first lower spacer 735 included in the first preliminary filling structure 790 may be higher than an upper surface of the fifth pad 910 included in the conductive pad structure 930.

Figure 44:
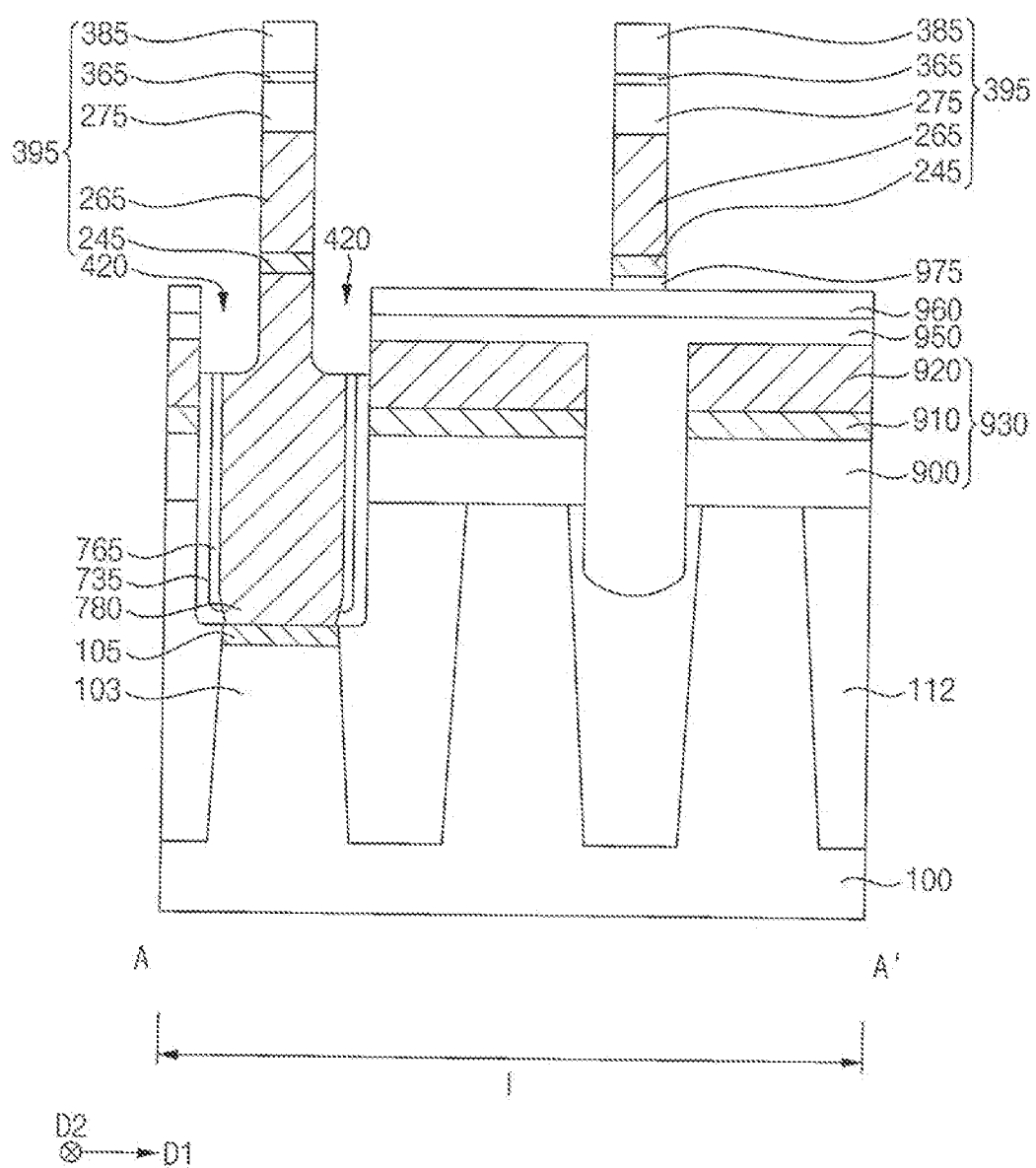

Referring to FIG. 44, processes substantially the same as or similar to those illustrated with reference to FIGS. 12 to 17 may be performed, so that the first filling pattern 780 and the first and second lower spacers 735 and 765 may be formed in the twelfth opening 995.

Only a portion of the ninth pad layer 970 under the bit line structure 395 may remain as the ninth pad pattern 975.

Figure 45:
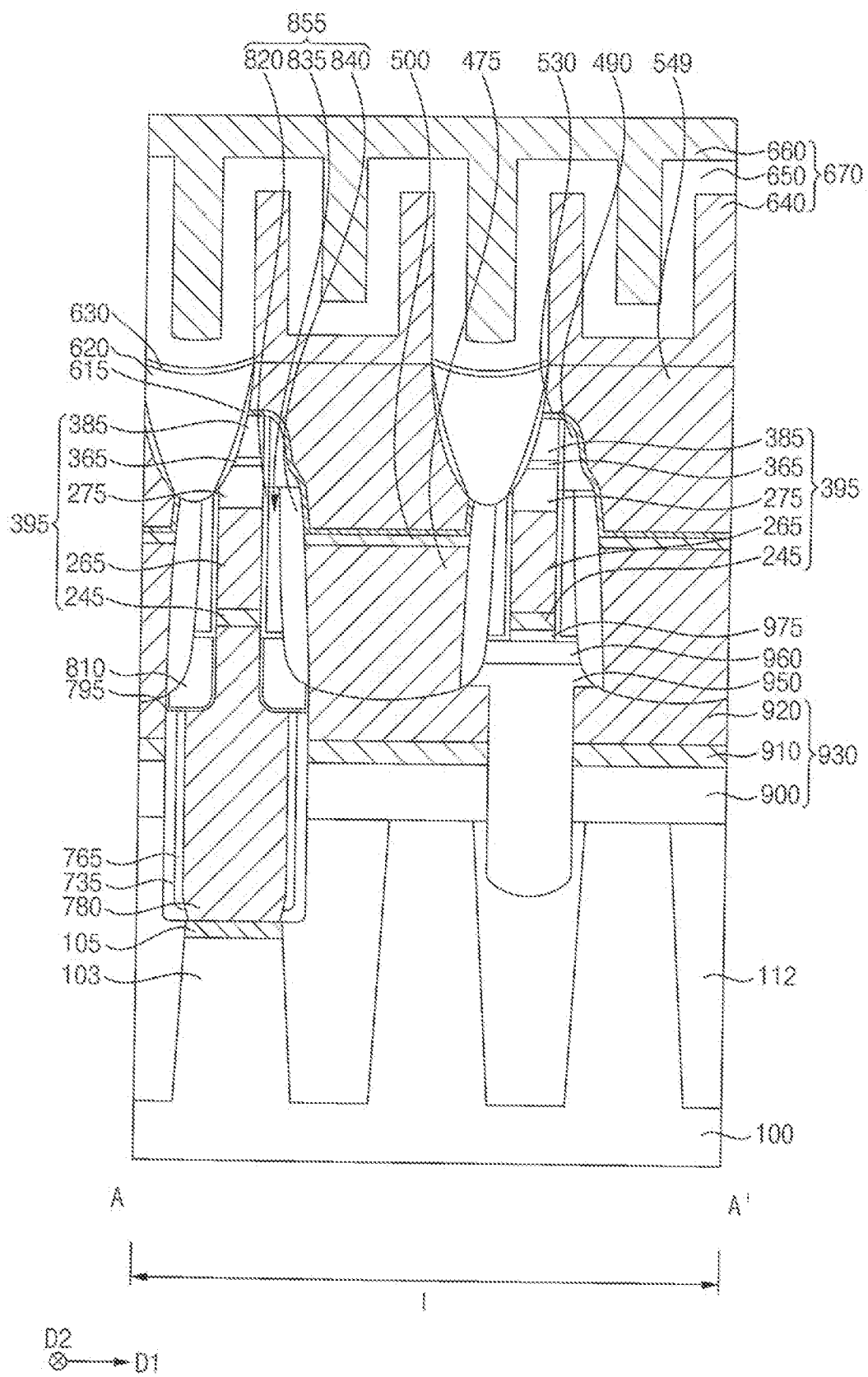

Referring to FIG. 45, processes substantially the same as or similar to those illustrated with reference to FIGS. 18 to 28 may be performed to complete the fabrication of the semiconductor device.

In example embodiments, the lower contact plug 475 may include a metal, e.g., tungsten in addition to doped polysilicon, and the lower and upper contact plugs 475 and 549 included in the contact plug structure may contain the same metal. Accordingly, the second metal silicide pattern 500 may not be formed between the lower and upper contact plugs 475 and 549.

In example embodiments, the lower contact plug 475 may contact an upper surface of the sixth pad 920 included in the conductive pad structure 930, and thus the lower contact plug 475 may be electrically connected to the active pattern 103 through the fourth to sixth pads 900, 910 and 920.

As described above, the conductive pad structure 930 and the insulating pad layer structure 980 may be formed on the active pattern 103 and the isolation pattern 112, and the first preliminary filling structure 790 may be formed in the twelfth opening 995 extending through the conductive pad structure 930 and the insulating pad layer structure 980 to expose the active pattern 103 and the isolation pattern 112.

When the third opening 420 is formed by removing the first sacrificial spacer 755 included in the first preliminary filling structure 790, the first lower spacer 735 may serve as an etch stop layer, and the uppermost surface of the first lower spacer 735 may be higher than the upper surface of the fifth pad 910 included in the conductive pad structure 930. Thus, a bottom of the third opening 420 may be higher the upper surface of the fifth pad 910 including, e.g., a metal silicide, and the fifth pad 910 may not be removed when the first sacrificial spacer 755 is removed.

When the first sacrificial spacer 755 only is formed without separately forming the first lower spacer 735, the first sacrificial spacer 755 may be excessively removed when the third opening 420 is formed by removing the first sacrificial spacer 755, and the fifth pad 910 may also be removed. In order to prevent the fifth pad 910 from being removed, a thickness of the sixth pad 920 that is included in the conductive pad structure 930 and formed on the fifth pad 910 has to be increased.

However, in example embodiments, the bottom of the third opening 420 may not be lower than the upper surface of the fifth pad 910 due to the first lower spacer 735 under the first sacrificial spacer 75, and thus the thickness of the sixth pad 920 including a metal may not be unnecessarily increased.

Figure 46:
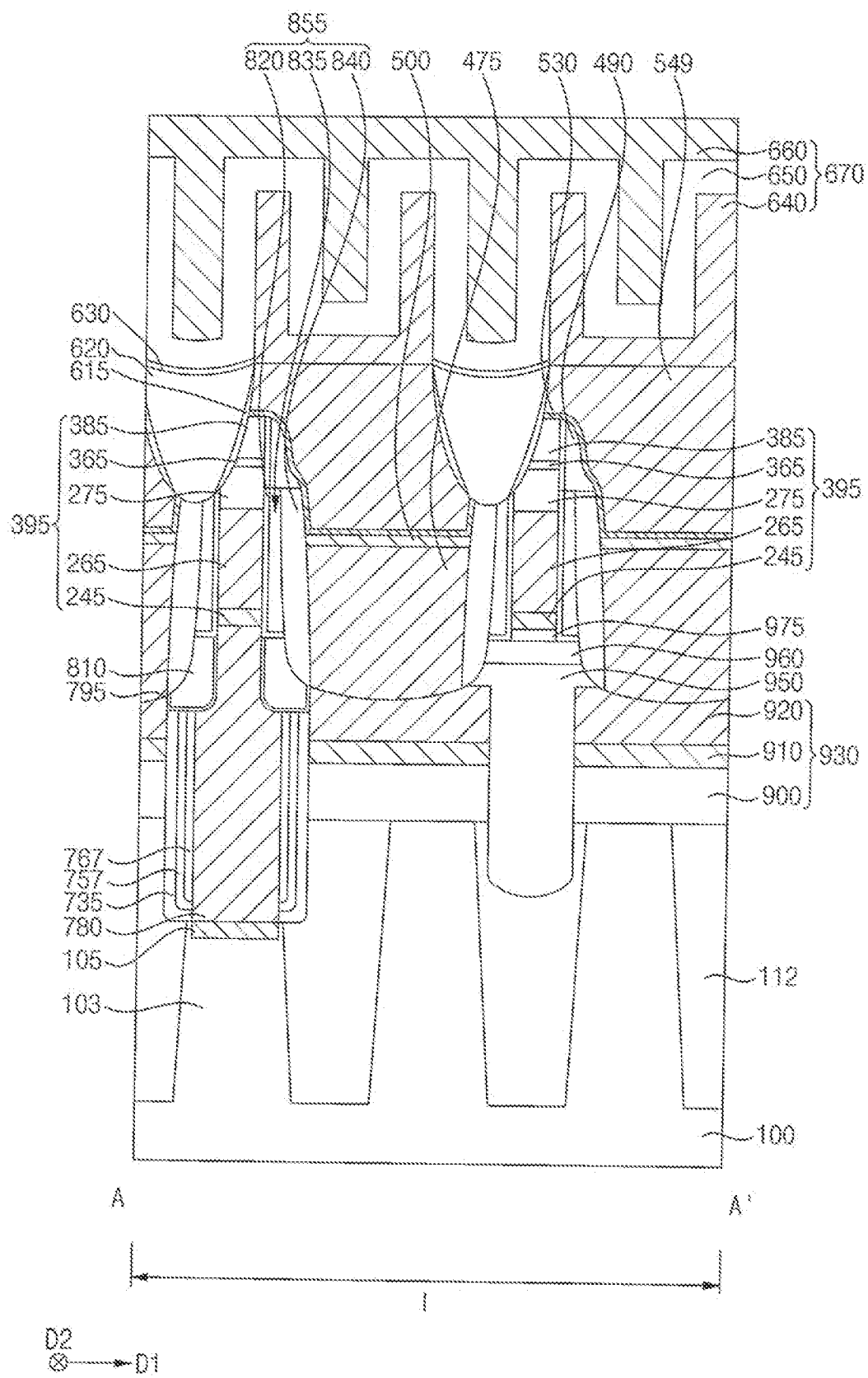
FIGS. 46 to 47 are cross-sectional views illustrating a method of manufacturing a semiconductor device in accordance with example embodiments.
Figure 47:
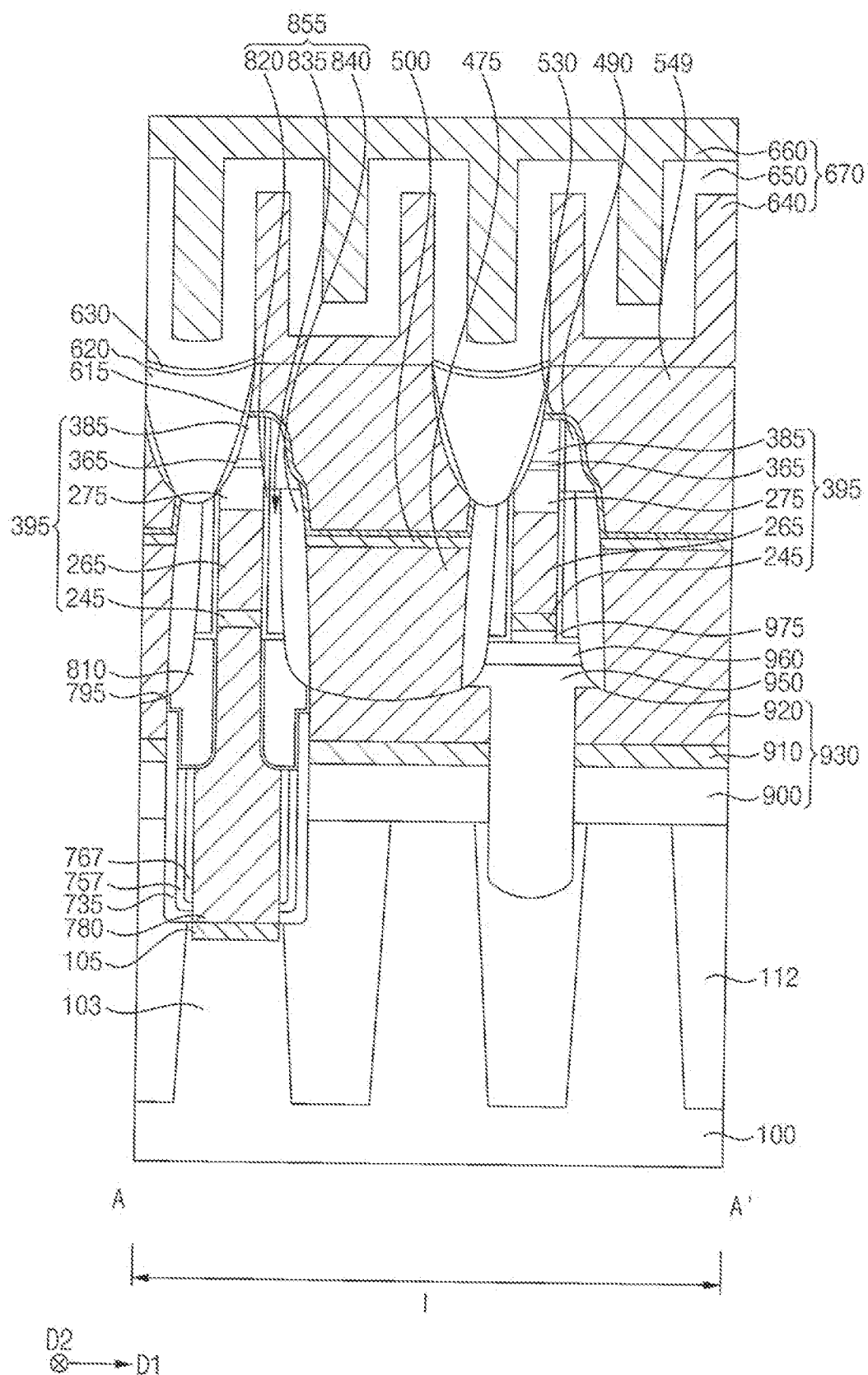

FIGS. 46 to 47 are cross-sectional views illustrating semiconductor devices in accordance with example embodiments. These semiconductor devices may be similar to the semiconductor devices illustrated with reference to FIGS. 34 and 38, respectively. However, as illustrated with reference to FIGS. 39 to 45, these semiconductor devices may be manufactured by a process forming the conductive pad structure 930 and the insulating pad layer structure 980 on the active pattern 103 and the isolation pattern 112.

Accordingly, referring to FIG. 46, the third, fourth and first lower spacers 767, 757 and 735 may be formed on the lower sidewall of the first filling pattern 780 in the horizontal direction substantially parallel to the upper surface of the substrate 100. In an example embodiment, the uppermost surface of the first, third and fourth lower spacers 735, 767 and 757 may be higher the upper surface of the fifth pad 910 included in the conductive pad structure 930.

Referring to FIG. 47, the third, fourth and first lower spacers 767, 757 and 735 may be sequentially formed on the lower sidewall of the first filling pattern 780 in the horizontal direction. In example embodiments, the uppermost surface of the first, third and fourth lower spacers 735, 767 and 757 may be higher the upper surface of the fifth pad 910 included in the conductive pad structure 930.

In example embodiments, the uppermost surface of the third and fourth lower spacers 767 and 757 may be lower than the uppermost surface of the first lower spacer 735.

While embodiments have been described with reference to the figures, it will be understood by those of ordinary skill in the art that various changes in form and details may be made therein without departing from the spirit and scope as defined by the following claims and their equivalents.

What is claimed is:

1. A semiconductor device comprising:
a conductive contact plug on a substrate, the conductive contact plug comprising a lower portion and an upper portion on the lower portion, the lower portion having a first width, and the upper portion having a second width less than the first width;
a bit line structure on the conductive contact plug, the bit line structure comprising a conductive structure and an insulation structure provided in a vertical direction perpendicular to an upper surface of the substrate; and
a first lower spacer, a second lower spacer, and a third lower spacer sequentially provided on a sidewall of the lower portion of the conductive contact plug in a horizontal direction parallel to the upper surface of the substrate,
wherein an uppermost surface of the third lower spacer is higher than an upper surface of the first lower spacer and an upper surface of the second lower spacer.

2. The semiconductor device according to claim 1, wherein the upper surface of the first lower spacer and the upper surface of the second lower spacer are coplanar with each other.

3. The semiconductor device according to claim 1, wherein the first lower spacer, the second lower spacer, and the third lower spacer include silicon oxycarbide (SiOC), silicon oxide, and silicon nitride, respectively.

4. The semiconductor device according to claim 1, further comprising:
a capping pattern on a sidewall of the upper portion of the conductive contact plug, an upper surface of the lower portion of the conductive contact plug, the upper surface of the first lower spacer, the upper surface of the second lower spacer, and an upper surface and an upper sidewall of the third lower spacer; and
an insulation filling pattern on the capping pattern.

5. The semiconductor device according to claim 4, further comprising an upper spacer structure on the capping pattern and the insulation filling pattern, the upper spacer structure being provided on a sidewall of the bit line structure.

6. The semiconductor device according to claim 1, further comprising an active pattern and an isolation pattern on the substrate, the isolation pattern being provided on a sidewall of the isolation pattern,
wherein the conductive contact plug contacts a central upper surface of the active pattern.

7. The semiconductor device according to claim 6, wherein the uppermost surface of the third lower spacer is higher than an upper surface of the isolation pattern in the vertical direction.

8. The semiconductor device according to claim 6, further comprising a conductive pad structure on the active pattern and the isolation pattern, the conductive pad structure overlapping at least a portion of the conductive contact plug in the horizontal direction.

9. The semiconductor device according to claim 8, wherein the conductive pad structure comprises a first pad, a second pad, and a third pad sequentially provided in the vertical direction, and
wherein the first pad, the second pad, and the third pad include polysilicon doped with impurities, metal silicide, and metal, respectively.

10. The semiconductor device according to claim 9, wherein the uppermost surface of the third lower spacer is higher than an upper surface of the second pad in the vertical direction.

\* \* \* \* \*